United States Patent
Debord et al.

(10) Patent No.: US 9,818,795 B2
(45) Date of Patent: Nov. 14, 2017

(54) CMOS COMPATIBLE THERMOPILE WITH LOW IMPEDANCE CONTACT

(71) Applicant: TEXAS INSTRUMENTS INCORPORATED, Dallas, TX (US)

(72) Inventors: Jeffrey R. Debord, Dallas, TX (US); Henry Litzmann Edwards, Garland, TX (US); Kenneth J. Maggio, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/255,243

(22) Filed: Sep. 2, 2016

(65) Prior Publication Data

US 2016/0372516 A1     Dec. 22, 2016

Related U.S. Application Data

(62) Division of application No. 14/292,281, filed on May 30, 2014, now Pat. No. 9,437,652.

(51) Int. Cl.

| H01L 29/66 | (2006.01) |
|---|---|
| H01L 27/16 | (2006.01) |
| H01L 35/04 | (2006.01) |
| H01L 21/768 | (2006.01) |
| H01L 21/8238 | (2006.01) |

(Continued)

(52) U.S. Cl.
CPC ........ *H01L 27/16* (2013.01); *H01L 21/76816* (2013.01); *H01L 21/76843* (2013.01); *H01L 21/76847* (2013.01); *H01L 21/76879* (2013.01); *H01L 21/823878* (2013.01); *H01L 23/485* (2013.01); *H01L 23/5226* (2013.01); *H01L 27/0617* (2013.01); *H01L 35/04* (2013.01);

(Continued)

(58) Field of Classification Search
CPC .. H01L 21/02697; H01L 21/768; H01L 35/34
See application file for complete search history.

(56) References Cited

U.S. PATENT DOCUMENTS

| 6,673,716 B1 | 1/2004 | D'Couto et al. |
|---|---|---|
| 8,674,413 B1 | 3/2014 | Chi |

(Continued)

FOREIGN PATENT DOCUMENTS

JP     2007243010 A     9/2007

*Primary Examiner* — Selim Ahmed
*Assistant Examiner* — Evan Clinton
(74) *Attorney, Agent, or Firm* — Michael A. Davis, Jr.; Charles A. Brill; Frank D. Cimino

(57) ABSTRACT

In described examples, an integrated circuit containing CMOS transistors and an embedded thermoelectric device may be formed by forming active areas which provide transistor active areas for an NMOS transistor and a PMOS transistor of the CMOS transistors and provide n-type thermoelectric elements and p-type thermoelectric elements of the embedded thermoelectric device. Stretch contacts with lateral aspect ratios greater than 4:1 are formed over the n-type thermoelectric elements and p-type thermoelectric elements to provide electrical and thermal connections through metal interconnects to a thermal node of the embedded thermoelectric device. The stretch contacts are formed by forming contact trenches in a dielectric layer, filling the contact trenches with contact metal and subsequently removing the contact metal from over the dielectric layer. The stretch contacts are formed concurrently with contacts to the NMOS and PMOS transistors.

10 Claims, 24 Drawing Sheets

(51) Int. Cl.
  *H01L 27/06*   (2006.01)
  *H01L 23/485*  (2006.01)
  *H01L 23/522*  (2006.01)
  *H01L 35/30*   (2006.01)
  *H01L 27/092*  (2006.01)

(52) U.S. Cl.
  CPC ............ *H01L 35/30* (2013.01); *H01L 27/092* (2013.01); *H01L 2924/0002* (2013.01)

(56) References Cited

U.S. PATENT DOCUMENTS

| | | |
|---|---|---|
| 2009/0056345 A1 | 3/2009 | Edwards et al. |
| 2009/0197376 A1 | 8/2009 | Kohno et al. |
| 2009/0266987 A1 | 10/2009 | Honda et al. |
| 2010/0032748 A1 | 2/2010 | Edwards |
| 2011/0023929 A1 | 2/2011 | Edwards |
| 2013/0104950 A1 | 5/2013 | Fornara et al. |
| 2014/0220748 A1 | 8/2014 | Huang et al. |

CMOS COMPATIBLE THERMOPILE WITH LOW IMPEDANCE CONTACT

CROSS-REFERENCE TO RELATED APPLICATIONS

This application is a divisional of U.S. patent application Ser. No. 14/292,281 filed May 30, 2014, which is hereby incorporated by reference in its entirety.

This patent application is related to the following patent applications: U.S. patent application Ser. No. 14/292,198 filed May 30, 2014 (pending); U.S. patent application Ser. No. 14/292,119 filed May 30, 2014 (issued as U.S. Pat. No. 9,231,025); and U.S. patent application Ser. No. 14/957,314 filed Dec. 2, 2015 (issued as U.S. Pat. No. 9,437,799). Those patent applications are not admitted to be prior art.

BACKGROUND

This relates generally to integrated circuits, and more particularly to a CMOS compatible thermopile with a low impedance contact.

Thermoelectric devices that are fabricated as parts of integrated circuits, in which the thermoelectric elements are formed of silicon, tend to have poor performance due to higher thermal and electrical impedance through metal interconnects to the thermoelectric elements than desired. Integrating low thermal and electrical impedance metal interconnects on the thermoelectric elements into an integrated circuit containing complementary metal oxide semiconductor (CMOS) transistors has been problematic.

SUMMARY

In described examples, an integrated circuit containing CMOS transistors and an embedded thermoelectric device may be formed by forming active areas which provide transistor active areas for an n-channel metal oxide semiconductor (NMOS) transistor and a p-channel metal oxide semiconductor (PMOS) transistor of the CMOS transistors and provide n-type thermoelectric elements and p-type thermoelectric elements of the embedded thermoelectric device. Stretch contacts with lateral aspect ratios greater than 4:1 are formed over the n-type thermoelectric elements and p-type thermoelectric elements to provide electrical and thermal connections through metal interconnects to a thermal node of the embedded thermoelectric device. The stretch contacts are formed by forming contact trenches in a dielectric layer, filling the contact trenches with contact metal and subsequently removing the contact metal from over the dielectric layer. The stretch contacts are formed concurrently with contacts to the NMOS and PMOS transistors.

DETAILED DESCRIPTION OF EXAMPLE EMBODIMENTS

The figures are not necessarily drawn to scale, and they are provided merely to illustrate. Several aspects are described below with reference to example applications for illustration. Numerous specific details, relationships and methods are set forth to provide an understanding of the examples. One or more of the specific details may be unnecessary. In other instances, well-known structures or operations are not shown in detail. The disclosures are not limited by the illustrated ordering of acts or events, as some acts may occur in different orders and/or concurrently with other acts or events. Furthermore, not all illustrated acts or events are required to implement a methodology.

An integrated circuit containing CMOS transistors and an embedded thermoelectric device may be formed by forming active areas which provide transistor active areas for an NMOS transistor and a PMOS transistor of the CMOS transistors and provide n-type thermoelectric elements and p-type thermoelectric elements of the embedded thermoelectric device. Stretch contacts with lateral aspect ratios greater than 4:1 are formed over the n-type thermoelectric elements and p-type thermoelectric elements to provide electrical and thermal connections through metal interconnects to a thermal node of the embedded thermoelectric device. The stretch contacts are formed by forming contact trenches in a dielectric layer, filling the contact trenches with contact metal and subsequently removing the contact metal from over the dielectric layer. The stretch contacts are formed concurrently with contacts to the NMOS and PMOS transistors.

Figure 1:
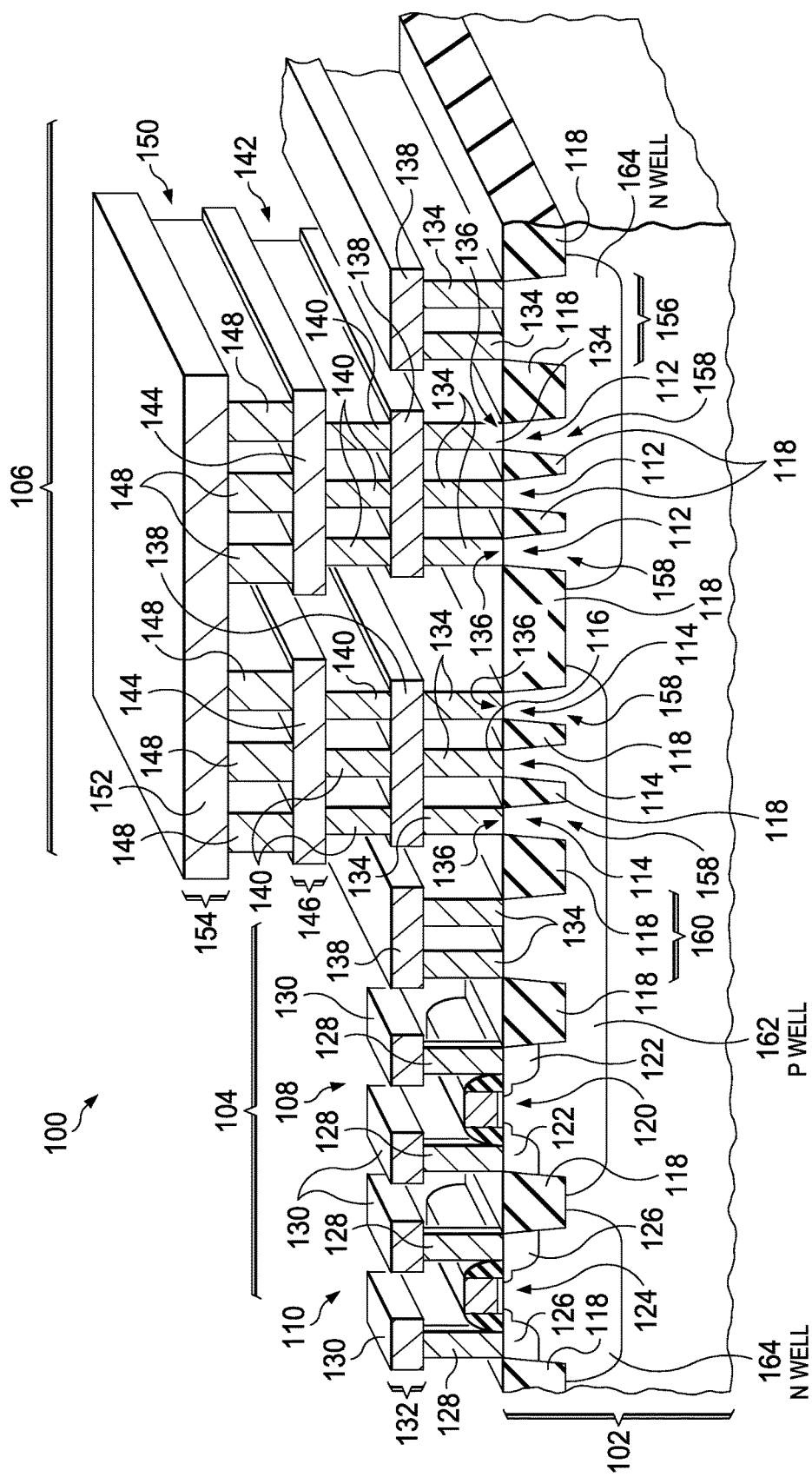
FIG. 1 is a cross section of an example integrated circuit containing CMOS transistors and an embedded thermoelectric device.

FIG. 1 is a cross section of an example integrated circuit containing CMOS transistors and an embedded thermoelectric device. The integrated circuit 100 is formed on a substrate 102 including silicon-based semiconductor material which may be for example a single crystal bulk silicon wafer or a silicon wafer with a silicon epitaxial layer. The integrated circuit 100 includes an area for the CMOS transistors 104 and the embedded thermoelectric device 106. The CMOS transistors 104 include an NMOS transistor 108 and a PMOS transistor 110. The embedded thermoelectric device 106 includes n-type thermoelectric elements 112 and p-type thermoelectric elements 114 in the substrate 102, extending to a top surface 116 of the substrate 102. The n-type thermoelectric elements 112 and p-type thermoelectric elements 114 are less than 300 nanometers wide at a narrowest position, for example at the top surface 116 of the substrate 102. The integrated circuit 100 includes field oxide 118 in isolation trenches laterally isolating active areas for the NMOS transistor 108, the PMOS transistor 110, the n-type thermoelectric elements 112 and p-type thermoelectric elements 114. The field oxide 118 may be formed by a shallow trench isolation (STI) process.

The NMOS transistor 108 includes a gate structure 120 over the substrate 102 and n-type source/drain regions 122 in the substrate 102 adjacent to and partially underlapping the gate structure 120. The PMOS transistor 110 includes a gate structure 124 over the substrate 102 and p-type source/drain regions 126 in the substrate 102 adjacent to and partially underlapping the gate structure 124. Contacts 128 provide electrical connections to the n-type source/drain regions 122 and the p-type source/drain regions 126. A lateral aspect ratio of one of the contacts 128 is the ratio of the lateral width to the lateral length of the contact at the top surface 116 of the substrate 102. In the instant example, the contacts 128 to the NMOS transistor 108 and the PMOS transistor 110 have lateral aspect ratios of 1:1 to 1.5:1. Other lateral aspect ratios for the contacts 128 to the NMOS transistor 108 and the PMOS transistor 110 are within the scope of the instant example. Interconnects 130 of a first metal level 132 are disposed over, and make electrical connection to, the contacts 128 to the NMOS transistor 108 and the PMOS transistor 110.

The embedded thermoelectric device 106 includes stretch contacts 134 which make electrical and thermal connections to upper ends 136 of the n-type thermoelectric elements 112 and the p-type thermoelectric elements 114. The stretch contacts 134 have lateral aspect ratios of greater than 4:1. The stretch contacts 134 in the embedded thermoelectric device 106 and the contacts 128 to the n-type source/drain regions 122 and the p-type source/drain regions 126 are formed concurrently and have a common layer structure. In one version of the instant example, the stretch contacts 134 and the contacts 128 may include a first liner of titanium, a second liner of titanium nitride on the first liner, and a fill metal of tungsten on the second liner. Other structures for the stretch contacts 134 and the contacts 128 are within the scope of the instant example. Additional instances of the stretch contacts 134 may also be disposed on the n-type thermal tap 156 and the p-type thermal tap 160.

Interconnects 138 of the first metal level 132 are disposed over, and make electrical and thermal connections to, the stretch contacts 134. One of the interconnects 138 is disposed over the n-type thermoelectric elements 112 and extends over and connects to all the stretch contacts 134 coupled to the n-type thermoelectric elements 112. Another of the interconnects 138 is disposed over the p-type thermoelectric elements 114 and extends over and connects to all the stretch contacts 134 coupled to the p-type thermoelectric elements 114. In one version of the instant example, the interconnects 130 over the NMOS transistor 108 and the PMOS transistor 110 and the interconnects 138 of the embedded thermoelectric device 106 may include an aluminum-based layer formed by a pattern and etch process. In another version, the interconnects 130 and the interconnects 138 may include a copper based layer formed by a single damascene process. Other structures for the interconnects 130 and the interconnects 138 are within the scope of the instant example. Additional instances of the interconnects 138 may be disposed over the n-type thermal tap 156 and the p-type thermal tap 160.

Stretch vias 140 of a first via level 142 are disposed over, and make electrical and thermal connection to, the interconnects 138 of the first metal level 132 over the n-type thermoelectric elements 112 and the p-type thermoelectric elements 114. A lateral aspect ratio of one of the stretch vias 140 is the ratio of the lateral width to the lateral length of the stretch via 140 at a top surface of the underlying interconnect 138. In one version of the instant example, the stretch vias 140 of the first via level 142 may have lateral aspect ratios greater than 4:1, advantageously providing lower thermal and electrical impedance than vias with lower lateral aspect ratios. In another version, the stretch vias 140 of the first via level 142 may have lateral aspect ratios of substantially 1:1. In one version of the instant example, the stretch vias 140 may include a titanium-based liner and a tungsten-based fill metal. In another version, the stretch vias 140 may include a titanium-based or tantalum-based liner and a copper-based fill metal formed by a single damascene process or a dual damascene process. Other structures for the stretch vias 140 are within the scope of the instant example.

Interconnects 144 of a second metal level 146 are disposed over, and make electrical and thermal connection to, the stretch vias 140 of the first-via-level 142. One of the interconnects 144 is disposed over the n-type thermoelectric elements 112 and extends over and connects to all the stretch vias 140 coupled to the n-type thermoelectric elements 112. Another of the interconnects 144 is disposed over the p-type thermoelectric elements 114 and extends over and connects to all the stretch vias 140 coupled to the p-type thermoelectric elements 114. In one version of the instant example, the interconnects 144 of the second metal level 146 may include an aluminum-based layer formed by a pattern and etch process. In another version, the interconnects 144 may include a copper based layer formed by a single damascene process. Other structures for the interconnects 144 are within the scope of the instant example.

Stretch vias 148 of a second via level 150 are disposed over, and make electrical and thermal connection to, the interconnects 144 of the second metal level 146 over the n-type thermoelectric elements 112 and the p-type thermoelectric elements 114. A lateral aspect ratio of one of the stretch vias 148 is the ratio of the lateral width to the lateral length of the stretch via 140 at a top surface of the underlying interconnect 144. In one version of the instant example, the stretch vias 148 of the second via level 150 may have lateral aspect ratios greater than 4:1. In another version, the stretch vias 148 may have lateral aspect ratios of substantially 1:1. In one version of the instant example, the stretch vias 148 of the second via level 150 may include a titanium-based liner and a tungsten-based fill metal. In another version, the stretch vias 148 may include a titanium-based or tantalum-based liner and a copper-based fill metal formed by a single damascene process or a dual damascene process. Other structures for the stretch vias 148 are within the scope of the instant example.

A thermal node 152 is disposed over, and makes electrical and thermal connections to, the stretch vias 148 of the second via level 150 which are coupled to the n-type thermoelectric elements 112 and the p-type thermoelectric elements 114. The thermal node 152 may be, for example, an interconnect element in a top layer of metallization 154 of the integrated circuit 100 as depicted in FIG. 1.

Dielectric layers such as a pre-metal dielectric (PMD) layer, intra-metal dielectric (IMD) layers and inter-level dielectric (ILD) layers, over the substrate surrounding the contacts 128 and stretch contacts 134, the interconnects 130, 138 and 144 and the stretch vias 140 and 148, are not shown in FIG. 1 to more clearly show the structure of the embedded thermoelectric device 106. The dielectric layers will be shown in succeeding figures discussing example fabrication processes for the integrated circuit 100.

The NMOS transistor 108 and the p-type thermoelectric elements 114 are disposed in one or more p-type wells 162. The p-type well 162 of the NMOS transistor 108 and the p-type well 162 of the p-type thermoelectric elements 114 may be the same p-type well 162 as depicted in FIG. 1, or may be separate. The PMOS transistor 110 and the n-type thermoelectric elements 112 are disposed in one or more n-type wells 164. The n-type well 164 of the PMOS transistor 110 and the n-type well 164 of the n-type thermoelectric elements 112 may separate as depicted in FIG. 1, or may be the same n-type well 164.

The embedded thermoelectric device 106 may also include an n-type thermal tap 156 which connects lower ends 158 of the n-type thermoelectric elements 112, electrically and thermally, to a first terminal of the embedded thermoelectric device 106, and a p-type thermal tap 160 which connects lower ends 158 of the p-type thermoelectric elements 114, electrically and thermally, to a second terminal of the embedded thermoelectric device 106.

The stretch contacts 134 advantageously provide lower electrical and thermal impedance between the interconnects 138 of the first metal level 132 and the n-type thermoelectric elements 112 and the p-type thermoelectric elements 114, compared to contacts with lateral aspect ratios of substantially 1:1, by providing a higher fraction of metal coverage. The interconnect 138 which extends over and connects to all the stretch contacts 134 coupled to the n-type thermoelectric elements 112, and the interconnect 138 which extends over and connects to all the stretch contacts 134 coupled to the p-type thermoelectric elements 114, advantageously provide lower electrical and thermal impedance between the stretch contacts 134 and the stretch vias 140, compared to segmented interconnects, by providing a higher fraction of metal coverage. The stretch vias 140 of the first via level 142 advantageously provide lower electrical and thermal impedance between the interconnects 138 of the first metal level 132 and the interconnects 144 of the second metal level 146 coupled to the n-type thermoelectric elements 112 and the p-type thermoelectric elements 114, compared to vias with lateral aspect ratios of substantially 1:1, by providing a higher fraction of metal coverage. The interconnect 144 which extends over and connects to all the stretch vias 140 coupled to the n-type thermoelectric elements 112, and the interconnect 144 which extends over and connects to all the stretch vias 140 coupled to the p-type thermoelectric elements 114, advantageously provide lower electrical and thermal impedance between the stretch vias 140 and the stretch vias 148 of the second via level 150, compared to segmented interconnects, by providing a higher fraction of metal coverage.

Figure 2A:
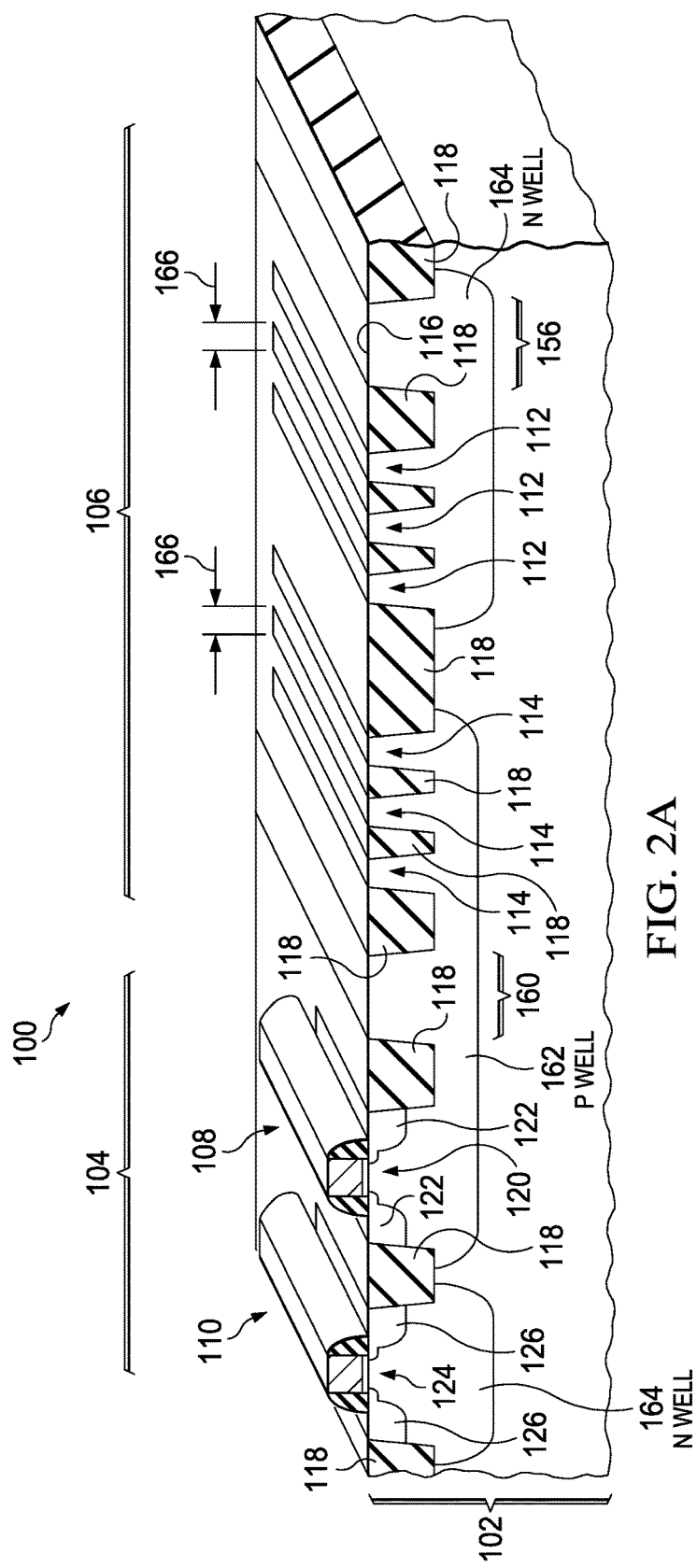
FIG. 2A through FIG. 2H are cross sections of the integrated circuit of FIG. 1, depicted in successive stages of an example fabrication sequence.

FIG. 2A through FIG. 2H are cross sections of the integrated circuit of FIG. 1, depicted in successive stages of an example fabrication sequence. Referring to FIG. 2A, the integrated circuit 100 is formed on the substrate 102 which may be a silicon wafer or other substrate 102 suitable for forming the integrated circuit 100. The field oxide 118 is formed in the substrate 102 to laterally isolate the active areas for the NMOS transistor 108, the PMOS transistor 110, the n-type thermoelectric elements 112, the p-type thermoelectric elements, the n-type thermal tap 156 and the p-type thermal tap 160. In the instant example, the n-type thermoelectric elements 112 and the p-type thermoelectric elements 114 are configured in arrays of linear active areas. Widths 166 of the linear active areas of the n-type thermoelectric elements 112 and the p-type thermoelectric elements 114 may be less than 300 nanometers.

The field oxide 118 may be formed by an STI process sequence, in which trenches, commonly 200 to 500 nanometers deep, are etched into the substrate 102, electrically passivated, commonly by growing a thermal oxide layer on sidewalls of the trenches, filled with insulating material, typically silicon dioxide, commonly by a high density plasma (HDP) process or an ozone based thermal chemical vapor deposition (CVD) process, also known as the high aspect ratio process (HARP), and subsequently planarized by a chemical mechanical polish (CMP) process.

The p-type well 162 is formed by forming an implant mask over the substrate 102 and implanting p-type dopants into the substrate 102 exposed by the implant mask. Similarly, the n-type wells 164 are formed by forming an implant mask over the substrate 102 and implanting n-type dopants into the substrate 102 exposed by the implant mask. The implanted p-type dopants and n-type dopants may be concurrently activated by an anneal process.

The gate structure 120 of the NMOS transistor 108 and the gate structure 124 of the PMOS transistor 110 are formed over the substrate 102. Portions or all of the gate structure 120 of the NMOS transistor 108 and the gate structure 124 of the PMOS transistor 110 may be formed concurrently. The n-type source/drain regions 122 are formed in the substrate 102 adjacent to and partially underlapping the gate structure 120 of the NMOS transistor 108 by implanting n-type dopants. The n-type dopants may optionally be implanted concurrently in the n-type thermoelectric elements 112 and/or the n-type thermal tap 156 to enhance performance of the embedded thermoelectric device 106. Similarly, the p-type source/drain regions 126 are formed in the substrate 102 adjacent to and partially underlapping the gate structure 124 of the PMOS transistor 110 by implanting p-type dopants. The p-type dopants may optionally be implanted concurrently in the p-type thermoelectric elements 114 and/or the p-type thermal tap 160 to enhance performance of the embedded thermoelectric device 106.

Metal silicide, not shown in FIG. 2A, may optionally be formed on exposed silicon at the top surface 116 of the substrate 102, for example on the n-type source/drain regions 122 and the p-type source/drain regions 126, and possibly on the n-type thermoelectric elements 112, the n-type thermal tap 156, the p-type thermoelectric elements 114 and the p-type thermal tap 160. The metal silicide may be, for example, titanium silicide, cobalt silicide or nickel silicide, formed by a self-aligned silicide process. The metal silicide may optionally be blocked from some areas of the substrate 102 using a patterned silicide block dielectric layer.

Figure 2B:
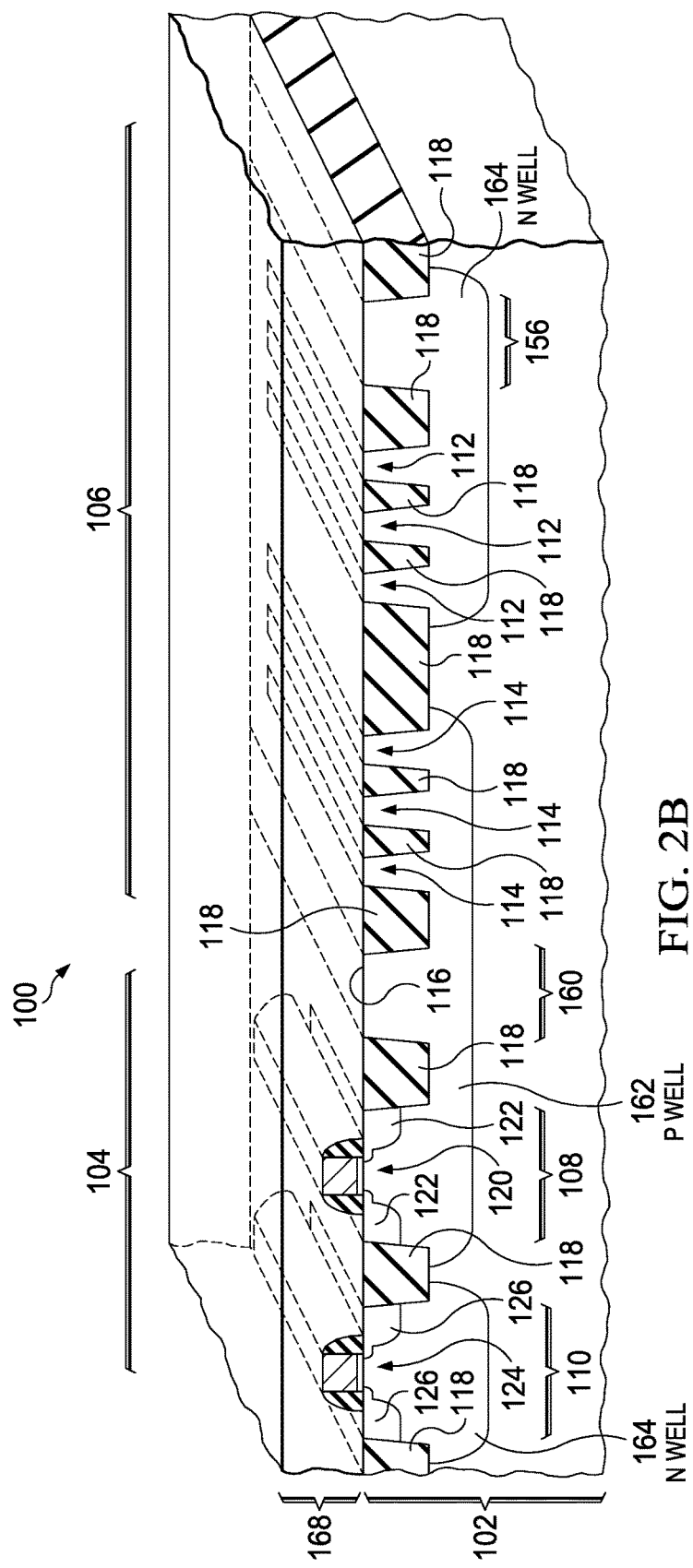

Referring to FIG. 2B, a PMD layer 168 is formed over an existing top surface of the integrated circuit 100. The PMD layer 168 may be a dielectric layer stack including a silicon nitride PMD liner 10 to 100 nanometers thick deposited by a plasma enhanced chemical vapor deposition (PECVD) process, a layer of silicon dioxide, phospho-silicate glass (PSG) or boro-phospho-silicate glass (BPSG), 100 to 1000 nanometers thick deposited by a PECVD process, planarized by a CMP process as depicted in FIG. 2B, and an optional PMD cap layer, commonly 10 to 100 nanometers of a hard material such as silicon nitride, silicon carbide nitride or silicon carbide.

Figure 2C:
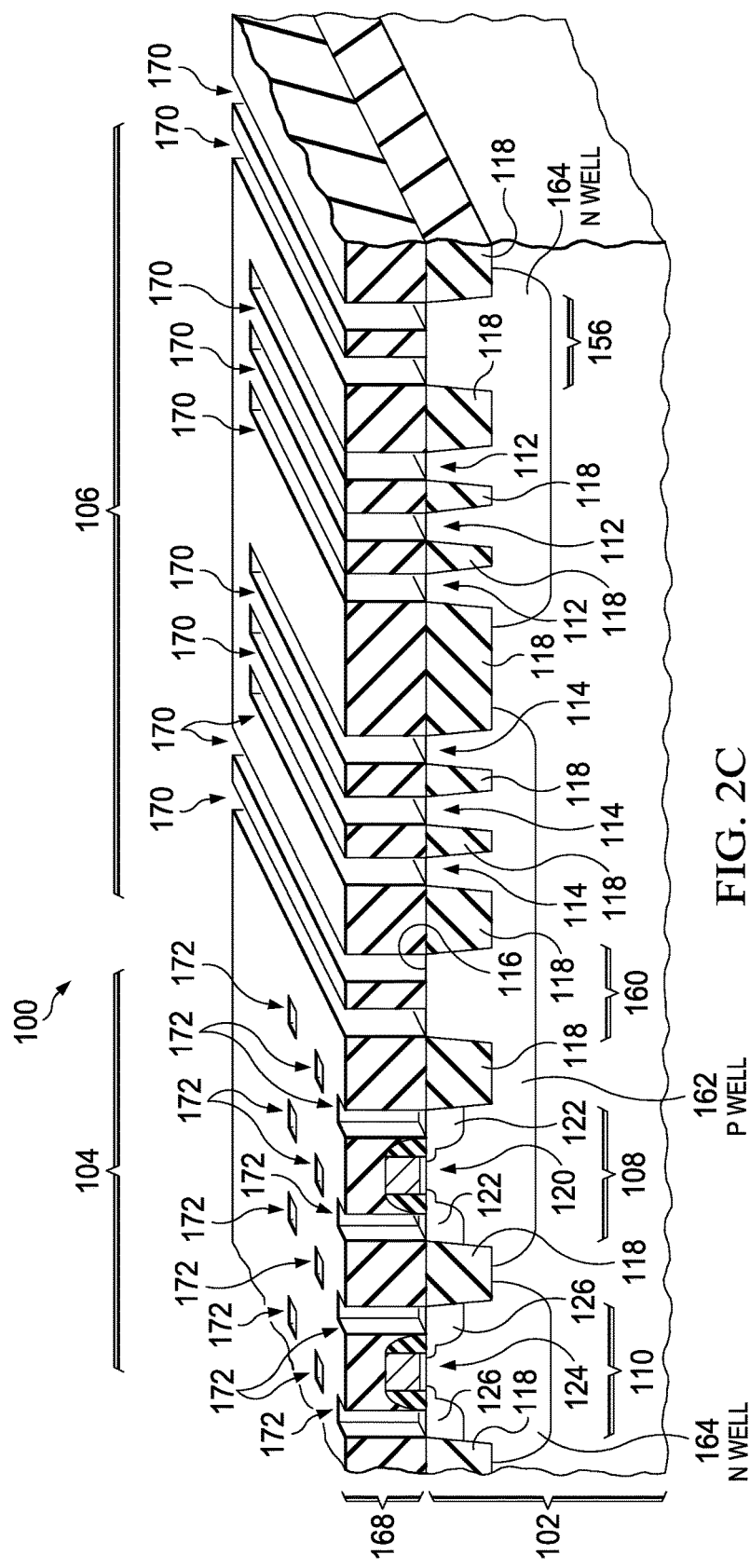

Referring to FIG. 2C, contact trenches 170 and contact holes 172 are formed in the PMD layer 168 so as to expose the top surface 116 of the substrate 102. The contact trenches 170 are formed over the n-type thermoelectric elements 112 and the p-type thermoelectric elements 114 with lateral aspect ratios greater than 4:1. The contact trenches 170 may also be formed over the n-type thermal tap 156 and the p-type thermal tap 160. The contact holes 172 are formed over the n-type source/drain regions 122 and the p-type source/drain regions 126. In the instant example, the contact holes 172 have lateral aspect ratios of 1:1 to 1.5:1.

The contact trenches 170 and the contact holes 172 are formed by forming a contact mask, not shown in FIG. 2C, over the PMD layer 168 which exposes areas for the contact trenches 170 and the contact holes 172. The contact mask may include photoresist formed by a photolithographic process, may include anti-reflection layers such as silicon nitride or an organic bottom anti-reflection coat (BARC), and may include hard mask material such as amorphous carbon. Dielectric material is removed from the PMD layer 168 in the areas exposed by the contact mask by a reactive ion etch (ME) process, so as to expose the substrate 102, including any metal silicide at the top surface 116. The contact mask is removed. A portion of the contact mask may be removed during the RIE process to form the contact trenches 170 and the contact holes 172. A residual portion of the contact mask may be removed after the contact trenches 170 and the contact holes 172 have been completely formed.

Figure 2D:
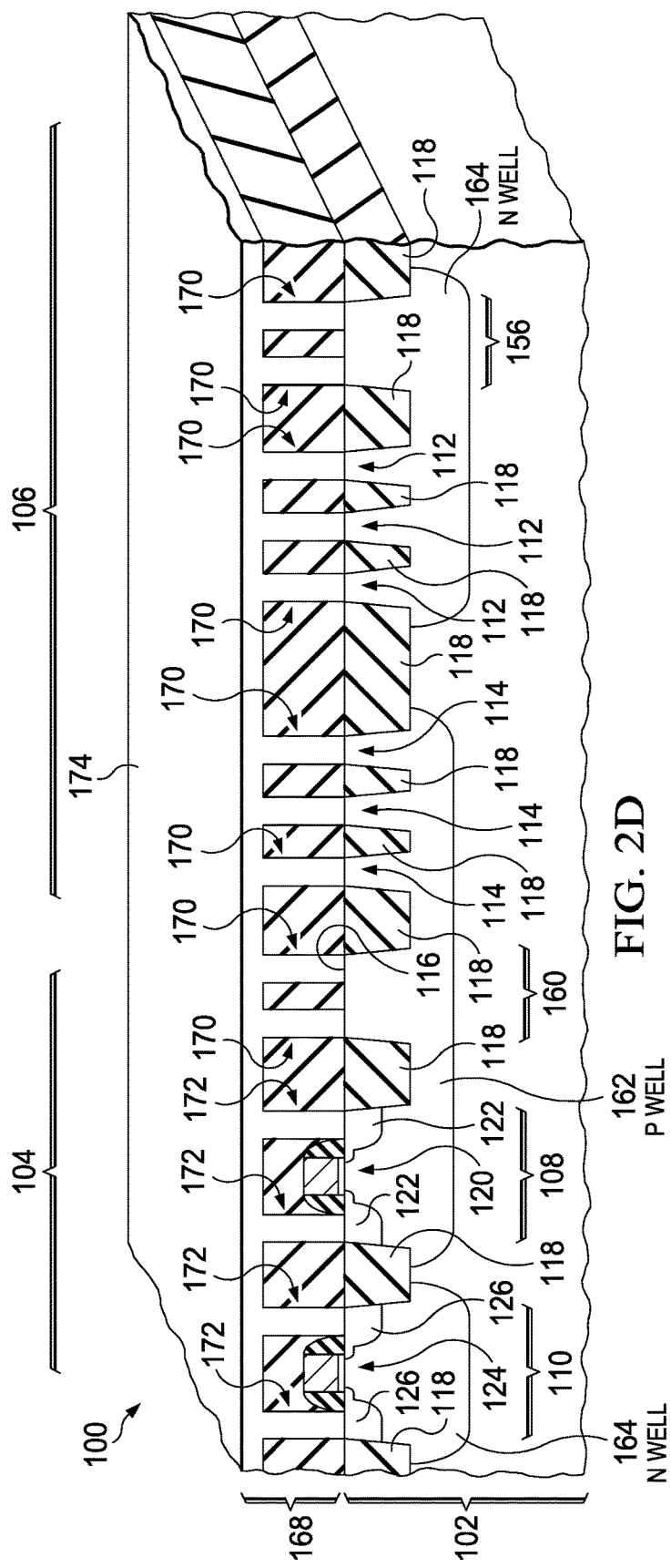

Referring to FIG. 2D, contact metal 174 is formed over the PMD layer 168, extending into the contact trenches 170 and the contact holes 172 so as to make electrical connections to the n-type source/drain regions 122, the p-type source/drain regions 126, the n-type thermoelectric elements 112, the p-type thermoelectric elements 114, the n-type thermal tap 156 and the p-type thermal tap 160. The contact metal 174 may include, for example, a first liner of titanium, 5 nanometers to 10 nanometers thick, formed by sputtering or ion plating. The contact metal 174 may include a second liner of titanium nitride formed on the first liner, the second liner being 10 nanometers to 20 nanometers thick, formed by an atomic layer deposition (ALD) process. The contact metal 174 may include a fill metal of tungsten formed on the second liner, formed by a metal organic chemical vapor deposition (MOCVD) process. The contact metal 174 is formed to fill the contact trenches 170 and the contact holes 172.

Figure 2E:
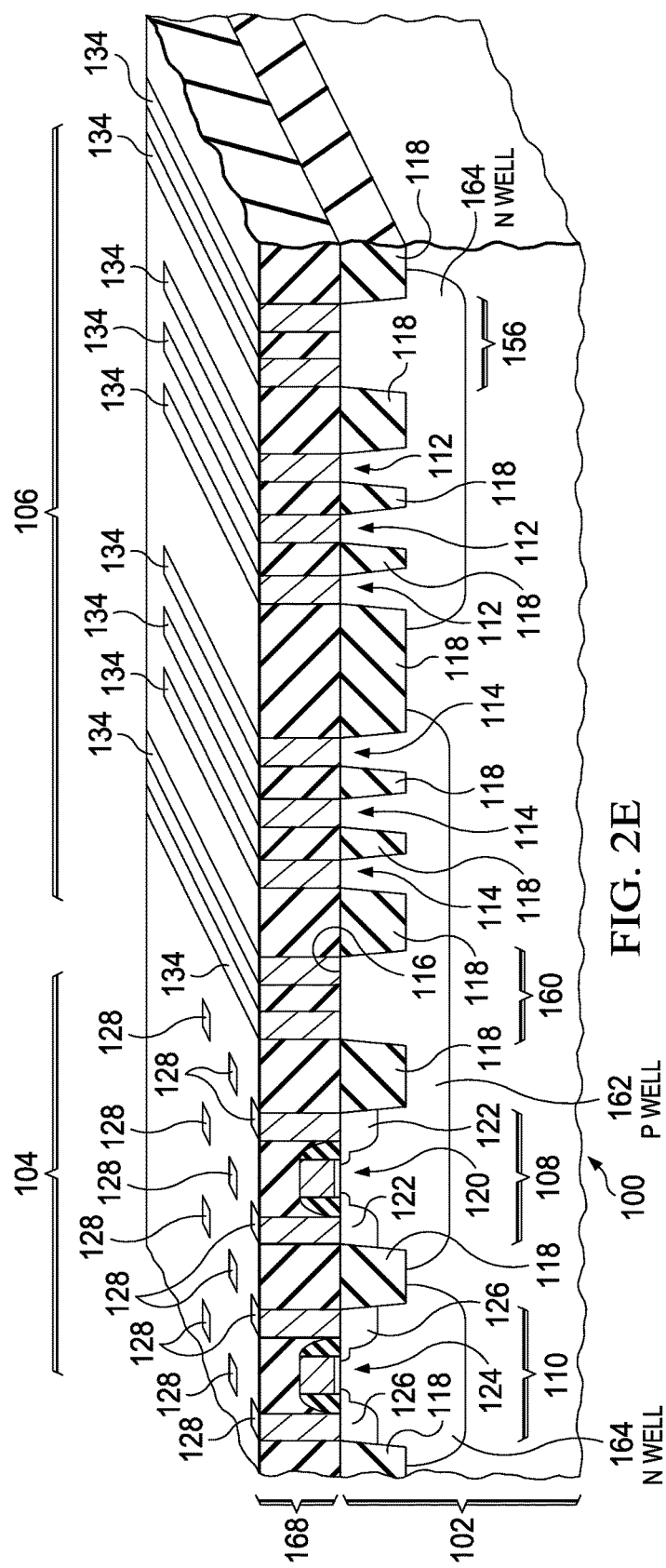

Referring to FIG. 2E, the contact metal 174 of FIG. 2D is removed from over a top surface of the PMD layer 168, leaving the contact metal 174 in the contact trenches 170 of FIG. 2D to form the stretch contacts 134 on the n-type thermoelectric elements 112, the p-type thermoelectric elements 114, the n-type thermal tap 156 and the p-type thermal tap 160, and leaving the contact metal 174 in the contact holes 172 of FIG. 2D to form the contacts 128 on the n-type source/drain regions 122 and the p-type source/drain regions 126. The contact metal 174 may be removed by a plasma etchback process and/or a tungsten CMP process.

Figure 2F:
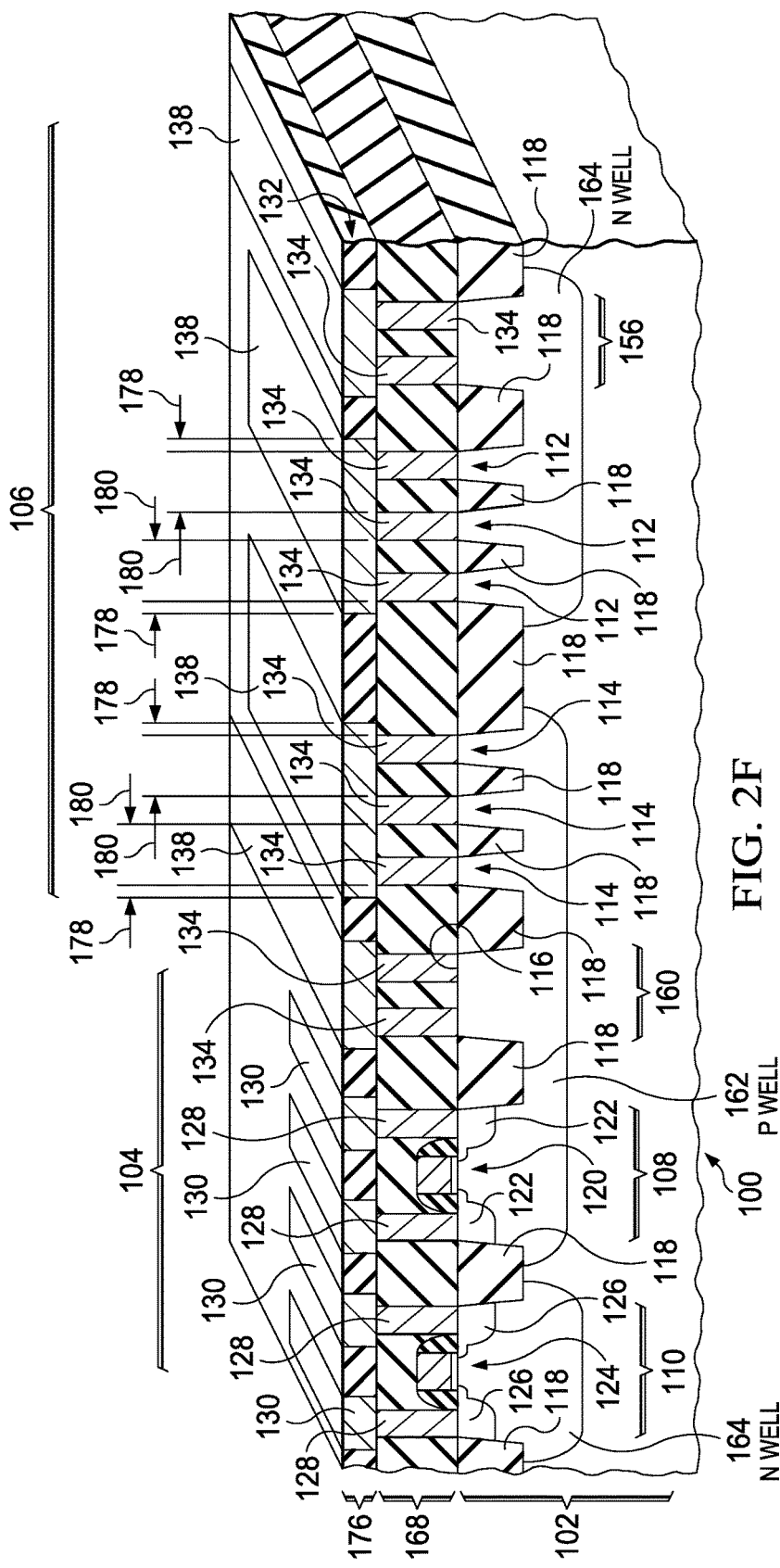

Referring to FIG. 2F, a first IMD layer 176, and the interconnects 130 and 138 and other interconnects of the first metal level 132 are formed over the PMD layer 168, contacts 128 and stretch contacts 134. The interconnects 130 make electrical connections to the contacts 128 in the area for the CMOS transistors 104. The interconnects 138 make electrical connections to the stretch contacts 134 in the embedded thermoelectric device 106.

In one version of the instant example, the interconnects 130 and 138 may be formed before the first IMD layer 176, by forming a layer of interconnect metal over the PMD layer 168, contacts 128 and stretch contacts 134. The layer of interconnect metal may include an adhesion layer of titanium, titanium tungsten or titanium nitride, a main layer of aluminum 50 nanometers to 200 nanometers thick, possibly including a few percent of silicon, titanium and/or copper, and a cap layer of titanium nitride. An etch mask is formed over the layer of interconnect metal to cover areas for the interconnects 130 and 138. An etch process, such as an RIE process using chlorine radicals, removes the layer of interconnect metal exposed by the etch mask to leave the remaining interconnect metal to form the interconnects 130 and 138. The etch mask is removed. A layer of dielectric material is subsequently formed on the PMD layer 168 between the interconnects 130 and 138 to form the first IMD layer 176. Excess dielectric material may be removed from top surfaces of the interconnects 130 and 138 by etchback or CMP processes.

In another version of the instant example, using a single damascene process, the first IMD layer 176 may be formed before the interconnects 130 and 138. A layer of dielectric material may be formed over the PMD layer 168, contacts 128 and stretch contacts 134 to provide the first IMD layer 176. A trench mask is formed over the first IMD layer 176 to exposes areas for the interconnects 130 and 138. A trench etch process such as an RIE process using fluorine radicals removes dielectric material from the first IMD layer 176 to form interconnect trenches which expose the contacts 128 and stretch contacts 134. The trench etch mask is removed. Interconnect metal is formed over the first IMD layer 176, extending into the interconnect trenches to make electrical connections to the contacts 128 and stretch contacts 134. The interconnect metal may include, for example, a liner of tantalum nitride or titanium nitride formed by an ALD process, a seed layer of sputtered copper on the liner, and a fill metal of electroplated copper on the seed layer. The interconnect metal is removed from over a top surface of the first IMD layer 176 by a copper CMP process, leaving the interconnect metal in the interconnect trenches to provide the interconnects 130 and 138.

The interconnects 138 may advantageously overlap the stretch contacts 134 on the n-type and p-type thermoelectric elements 112 and 114 by an overlap distance 178 which is 25 percent to 50 percent of an average pitch 180 of the stretch contacts 134 on the n-type and p-type thermoelectric elements 112 and 114. If the overlap distance 178 is less than 25 percent of the average pitch 180 of the stretch contacts 134, reduced thermal conductivity to the stretch contacts 134 through the interconnects 138 may reduce performance of the embedded thermoelectric device 106. If the overlap distance 178 is more than 50 percent of the average pitch 180 of the stretch contacts 134, increased parallel thermal conductivity through the PMD layer 168 and field oxide 118 may reduce performance of the embedded thermoelectric device 106.

Figure 2G:
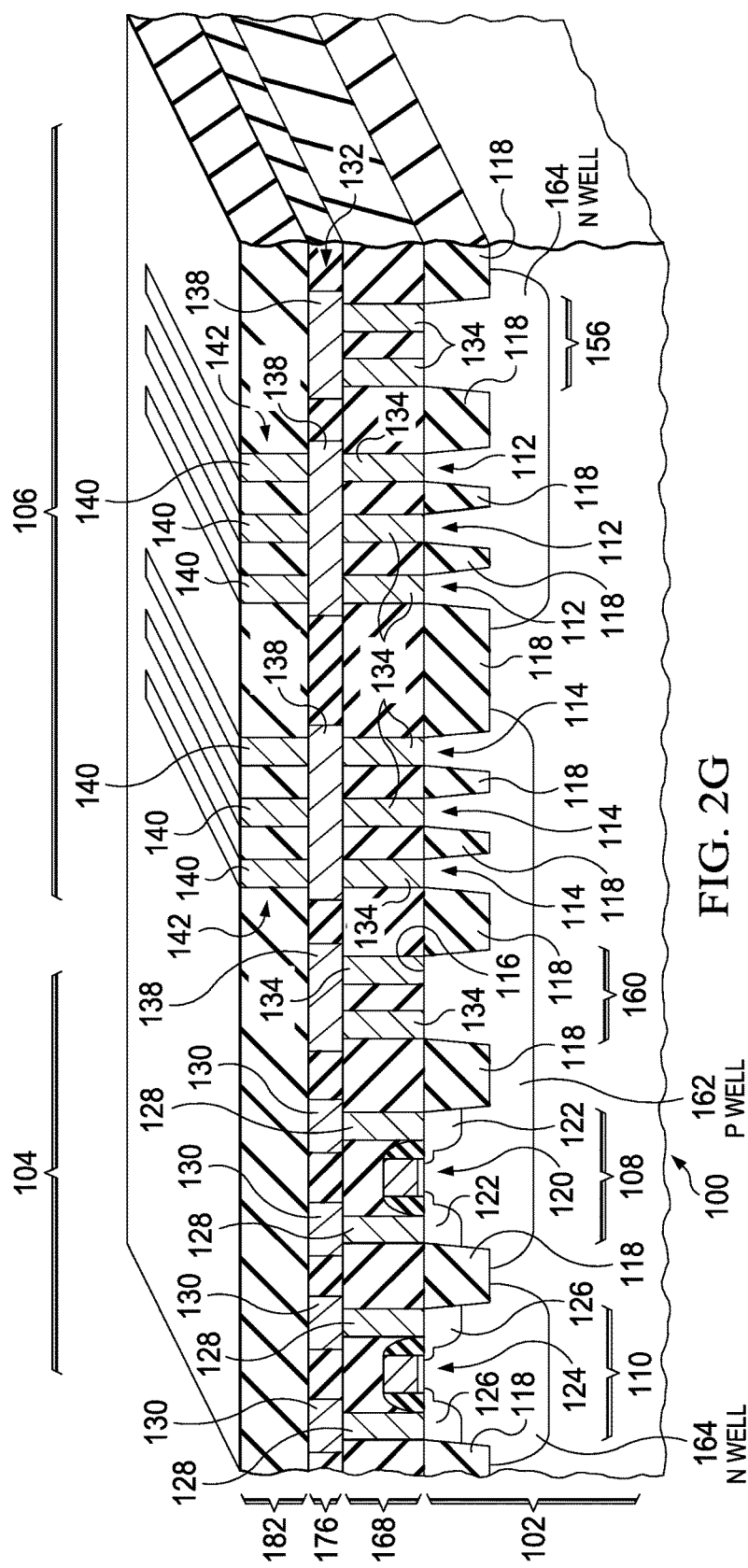

Referring to FIG. 2G, an ILD layer 182 and the stretch vias 140 and other vias of the first via level 142 are formed over the first IMD layer 176 and the interconnects 130 and 138. The stretch vias 140 make electrical and thermal connections to the interconnects 138 over the n-type and p-type thermoelectric elements 112 and 114.

The ILD layer 182 is formed as a dielectric layer stack over the first IMD layer 176 and the interconnects 130 and 138. The ILD layer 182 may include an etch stop layer of silicon carbide nitride and a main layer of low-k dielectric material such as organic silicate glass (OSG) 50 nanometers to 150 nanometers thick, and a cap layer of silicon nitride or silicon carbide.

In one version of the instant example, a via mask is formed over the ILD layer 182 to expose areas for the stretch vias 140 and other vias in the first via level 142. A via etch process such as an RIE process removes dielectric material from the exposed ILD layer 182 to form via trenches for the stretch vias 140 and via holes for vias in the area for the CMOS transistors 104. The via mask is removed. Via metal is formed over the ILD layer 182 extending into the via trenches and via holes to make electrical connection to the interconnects 138 and other interconnects in the first metal level 132. The via metal may include, for example, a first liner of titanium, a second liner of titanium nitride on the first liner, and a fill metal of tungsten on the second liner. The via metal is removed from over a top surface of the ILD layer 182 by an etchback and/or a tungsten CMP process, leaving the via metal in the via trenches and via holes to provide the stretch vias 140 and other vias of the first via level 142.

In another version of the instant example, the via metal may include a liner of tantalum nitride or titanium nitride formed by an ALD process, a seed layer of sputtered copper on the liner, and a fill metal of electroplated copper on the seed layer, and the stretch vias 140 and other vias of the first via level 142 may be formed by a single damascene process. In a further version, the stretch vias 140 and other vias of the first via level 142 may be formed concurrently with interconnects of the second metal level 146 of FIG. 1, by a dual damascene process.

Figure 2H:
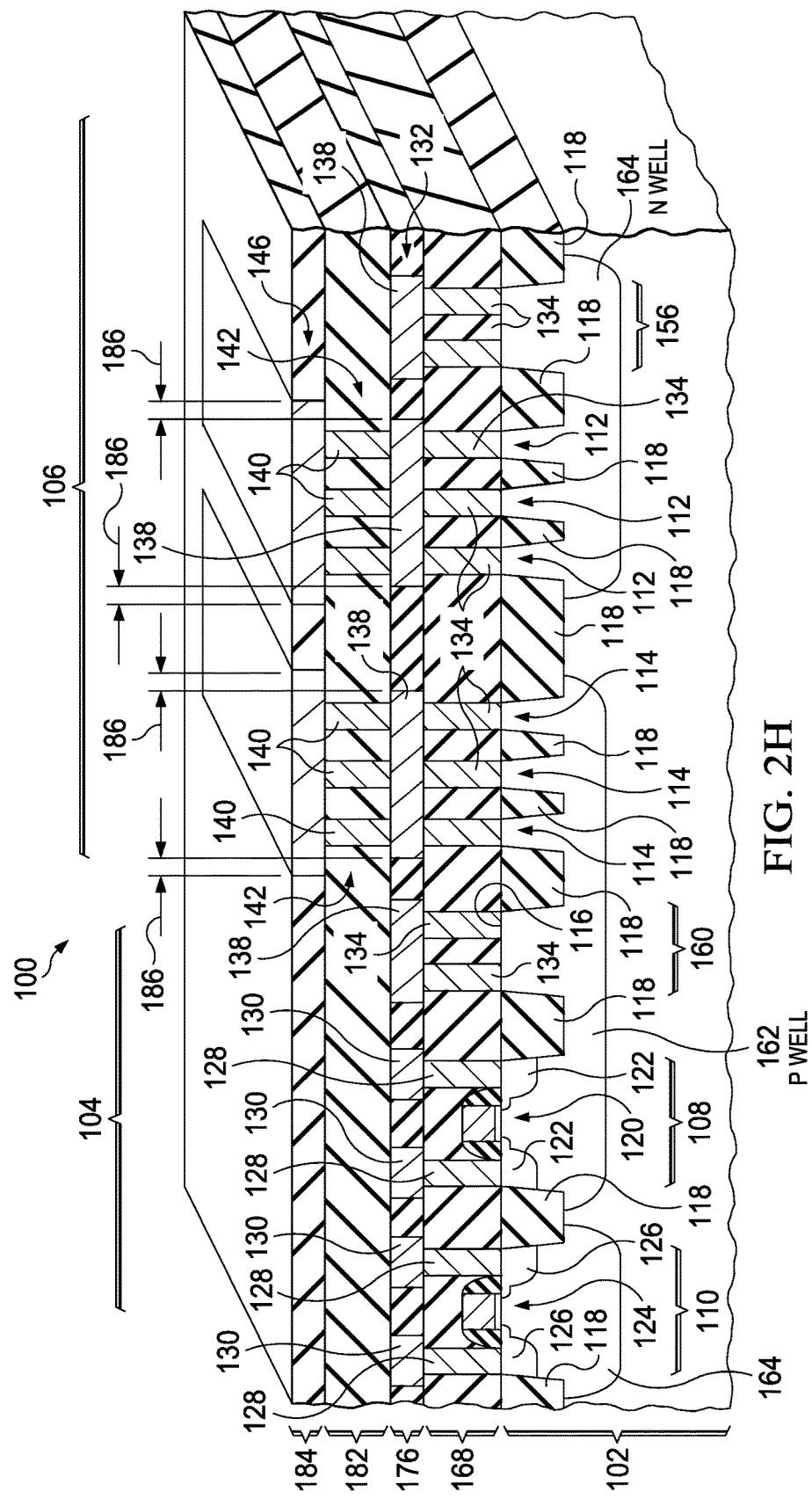

Referring to FIG. 2H, a second IMD layer 184 and the interconnects 144 of the embedded thermoelectric device 106 and other interconnects of the second metal level 146 are formed over the ILD layer 182 and the stretch vias 140 and other vias of the first via level 142. The interconnects 144 make electrical connections to the stretch vias 140. The second IMD layer 184 and the interconnects 144 of the embedded thermoelectric device 106 and other interconnects of the second metal level 146 may be formed by any of the alternative methods as described in reference to FIG. 2F. The interconnects 144 of the embedded thermoelectric device 106 in the second metal level 146 may advantageously overlap the interconnects 138 of the embedded thermoelectric device 106 in the first metal level 132 by an overlap distance 186 that is no more than 25 percent of the average pitch 180 of the stretch contacts 134 on the n-type and p-type thermoelectric elements 112 and 114. Forming the interconnects 144 with the overlap distance 186 may accrue similar advantages as described in reference to FIG. 2F. Formation of the integrated circuit 100 continues with formation of additional dielectric layers and metal levels to provide the structure of FIG. 1.

Figure 3A:
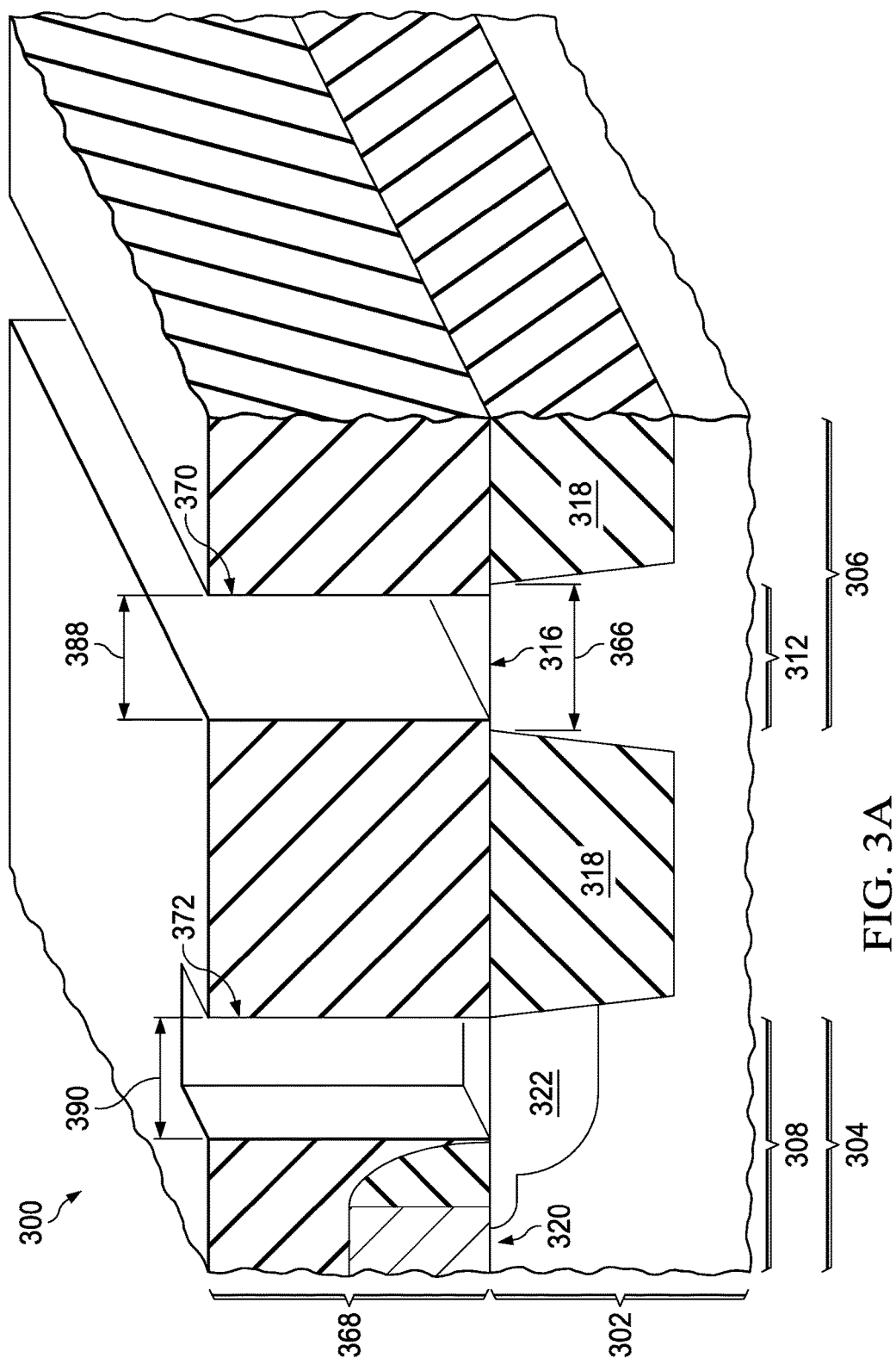
FIG. 3A through FIG. 3C are cross sections of an example integrated circuit containing CMOS transistors and an embedded thermoelectric device, depicted in successive stages of fabrication of a stretch contact on a thermoelectric element.
Figure 3B:
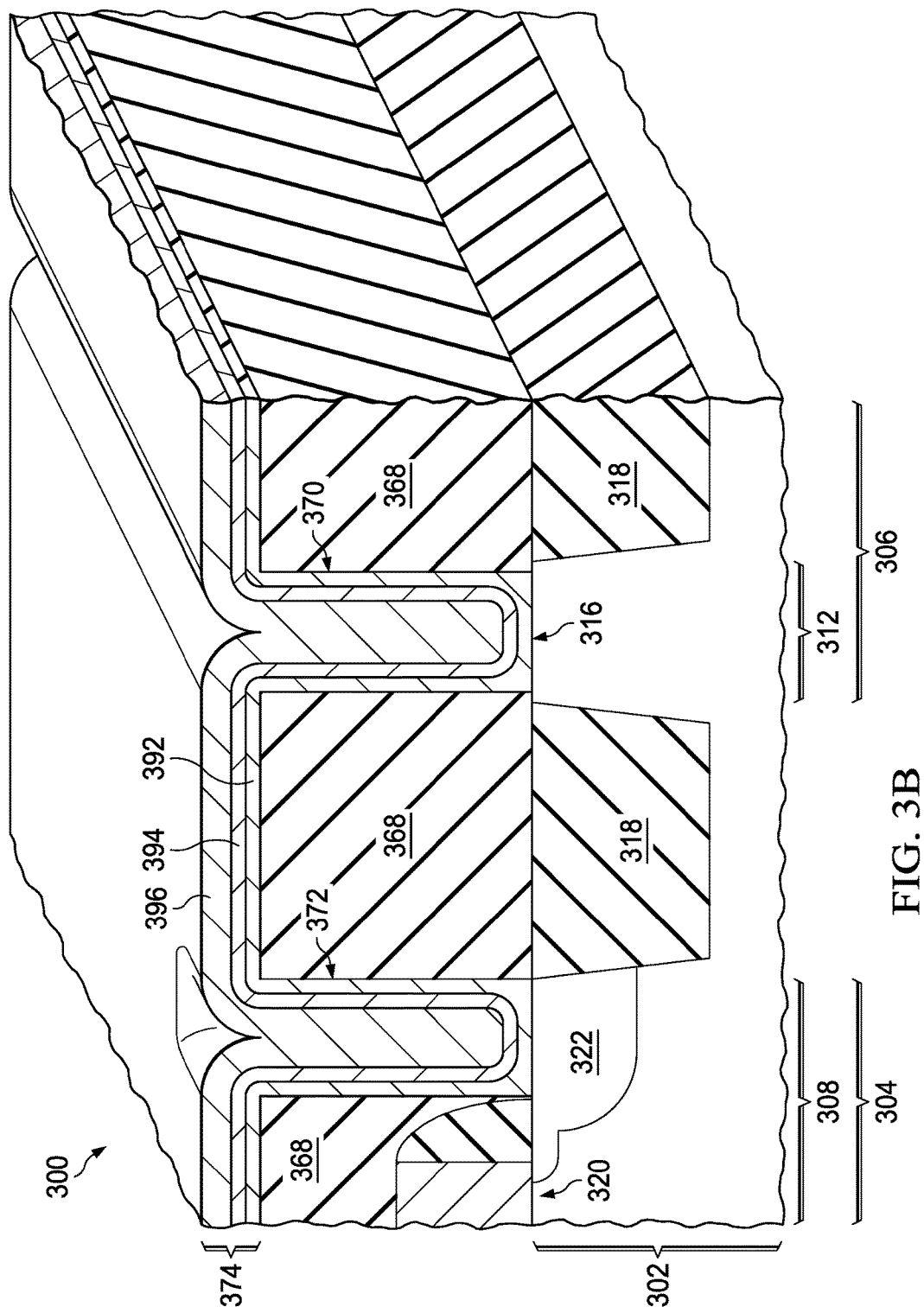
Figure 3C:
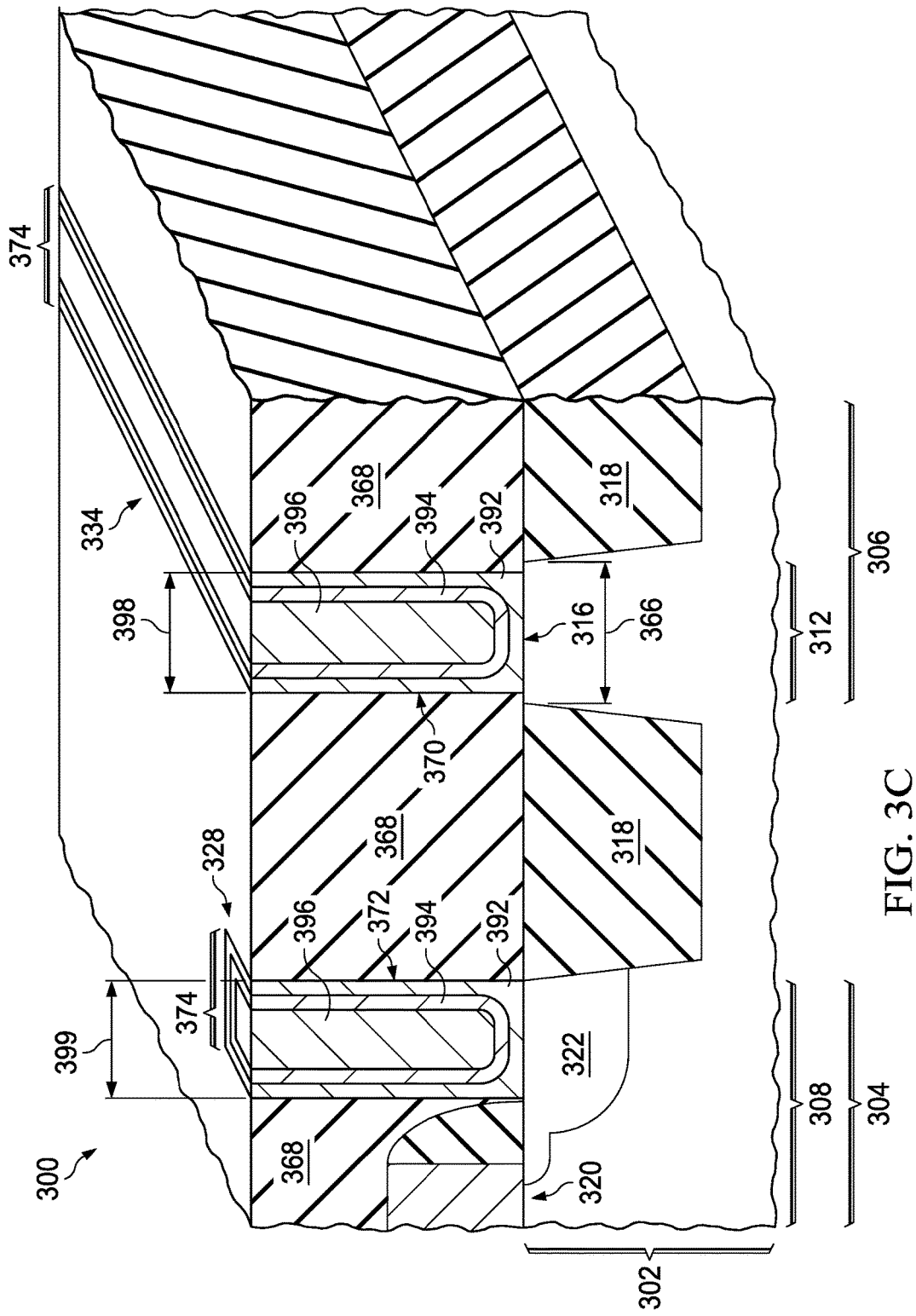

FIG. 3A through FIG. 3C are cross sections of an example integrated circuit containing CMOS transistors and an embedded thermoelectric device, depicted in successive stages of fabrication of a stretch contact on a thermoelectric element. Referring to FIG. 3A, the integrated circuit 300 is formed on a substrate 302 as described in reference to FIG. 1 and FIG. 2A. Field oxide 318 is formed in the substrate 302 to laterally isolate active areas of the integrated circuit 300, including an active area for a metal oxide semiconductor (MOS) transistor 308 in an area for CMOS transistors 304 and an active area for a thermoelectric element 312 of the embedded thermoelectric device 306. A gate structure 320 of the MOS transistor 308 is formed over the substrate 302 in the active area for the MOS transistor 308. A source/drain region 322 of the MOS transistor 308 is formed in the substrate 302 adjacent to and partially underlapping the gate structure 320. A PMD layer 368 is formed over an existing top surface of the integrated circuit 300, as described in reference to FIG. 2B. The PMD layer 368 may optionally be planarized, as depicted in FIG. 3A.

A contact trench 370 and a contact hole 372 are formed through the PMD layer 368 to expose the thermoelectric element 312 and the source/drain region 322, respectively, as described in reference to FIG. 2C. In the instant example, the contact hole 372 has a lateral aspect ratio of substantially 1:1 and the contact trench 370 has a lateral aspect ratio greater than 4:1. In the instant example, a width 388 of the contact trench 370 is substantially equal to a width 390 of the contact hole 372, and the width 388 of the contact trench 370 is less than a width 366 of the thermoelectric element 312 at a top surface 316 of the substrate 302.

Referring to FIG. 3B, contact metal 374 is formed over the PMD layer 368, extending into the contact trench 370 and the contact hole 372 so as to make electrical connections to the thermoelectric element 312 and the source/drain region 322, respectively. The contact metal 374 may include, for example, a first liner 392 of titanium, 5 nanometers to 10 nanometers thick, formed by sputtering or ion plating, a second liner 394 of titanium nitride, 10 nanometers to 20 nanometers thick, formed by an ALD process on the first liner 392, and a fill metal 396 of tungsten formed by an MOCVD process on the second liner 394. The contact metal 374 is formed to fill the contact trench 370 and the contact hole 372. In the instant example, forming the width 388 of the contact trench 370 to be substantially equal to the width 390 of the contact hole 372 may enable a thickness of the contact metal 374 necessary to fill the contact trench 370 to be only 10 percent to 25 percent more than a thickness necessary to fill the contact hole 372, advantageously reducing fabrication cost and complexity of the integrated circuit 300 compared to a process using thicker contact metal.

Referring to FIG. 3C, the contact metal 374 is removed from over a top surface of the PMD layer 368, leaving the contact metal 374 in the contact trench 370 and the contact hole 372 to provide a stretch contact 334 on the thermoelectric element 312 and a contact 328 on the source/drain region 322, respectively. The contact metal 374 may be removed by an etchback process and/or a tungsten CMP process. In the instant example, a width 398 of the stretch contact 334 is substantially equal to a width 399 of the contact 328.

Figure 4A:
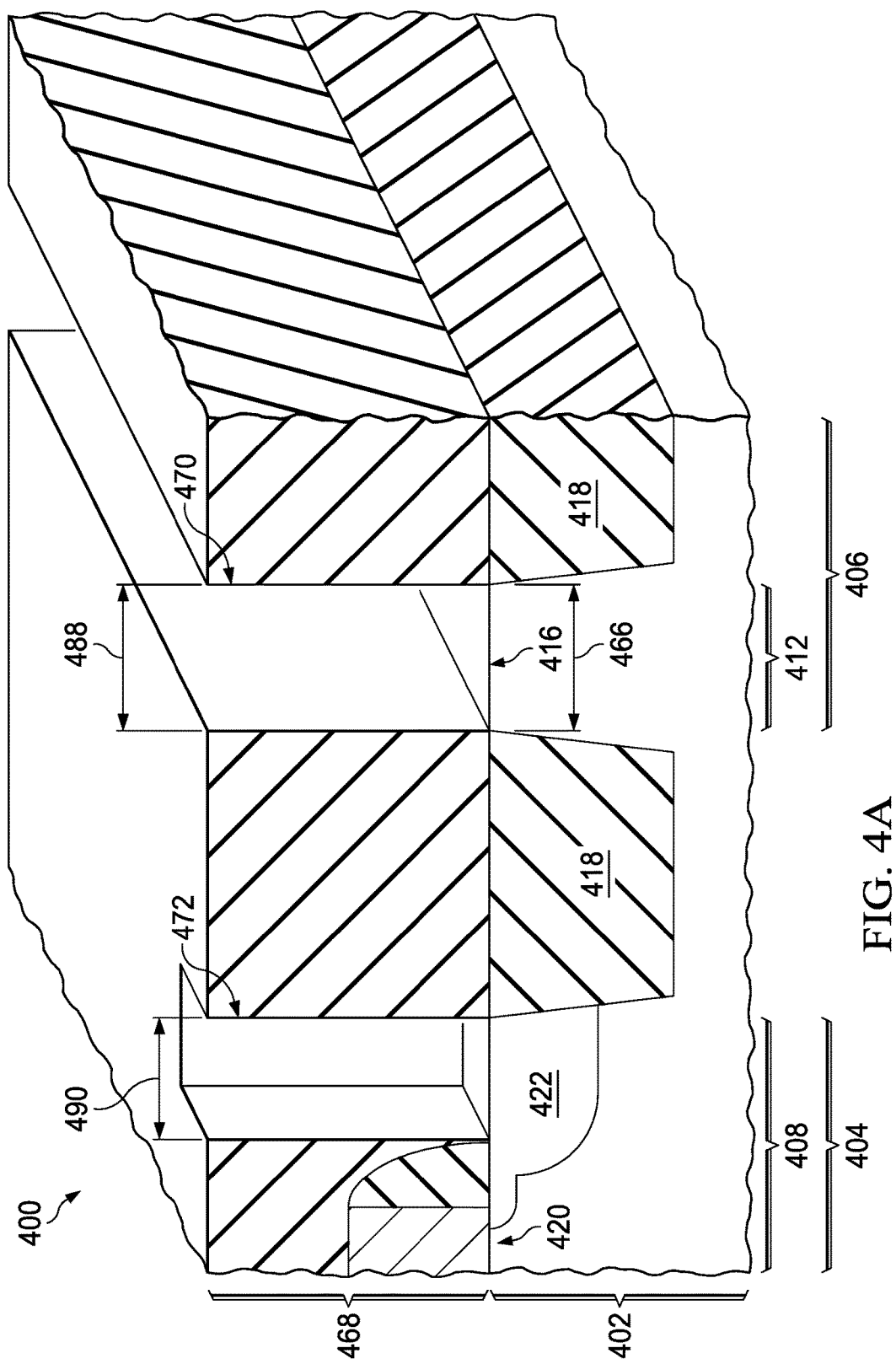
FIG. 4A through FIG. 4C are cross sections of another example integrated circuit containing CMOS transistors and an embedded thermoelectric device, depicted in successive stages of fabrication of a stretch contact on a thermoelectric element.
Figure 4B:
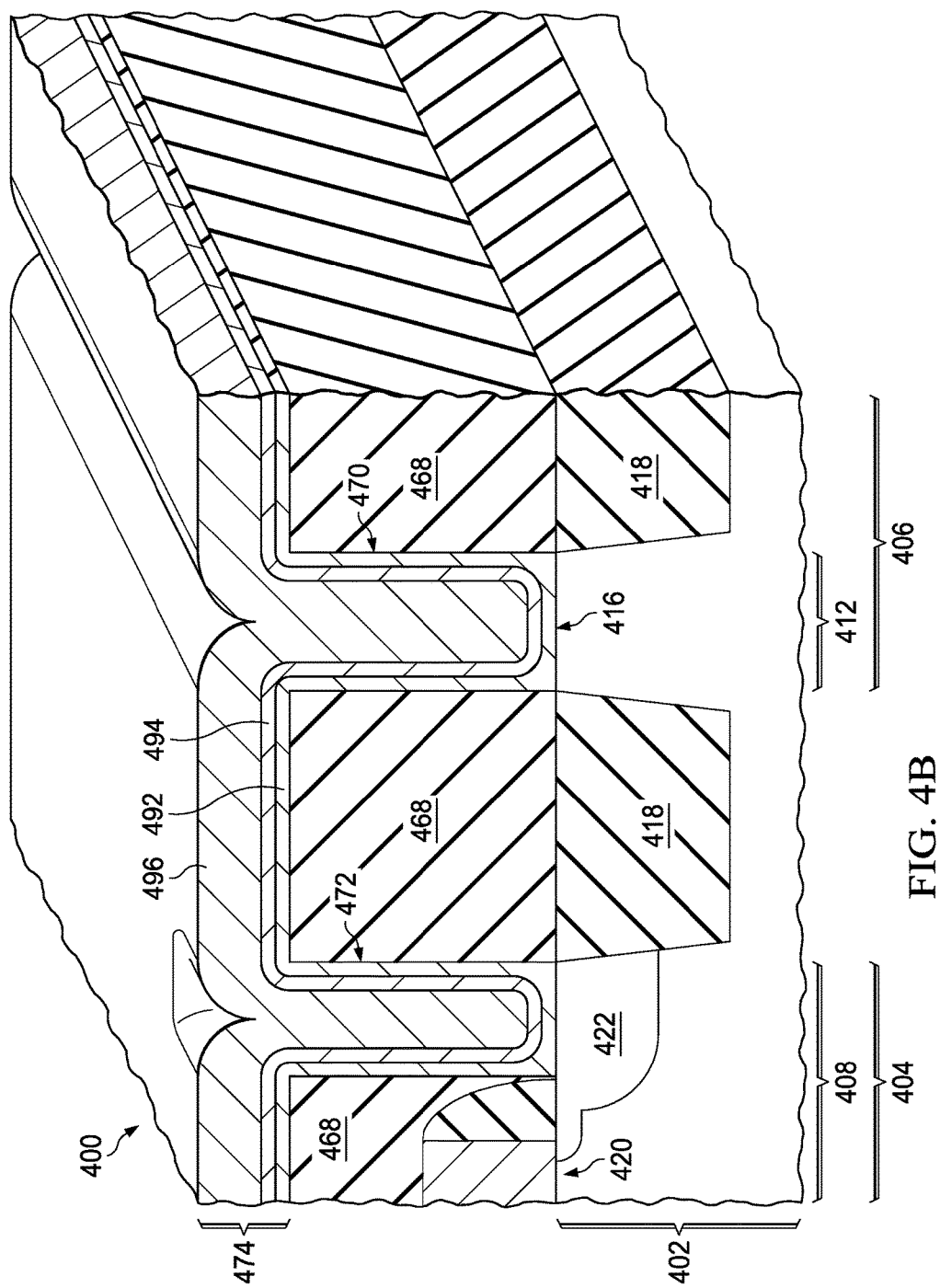
Figure 4C:
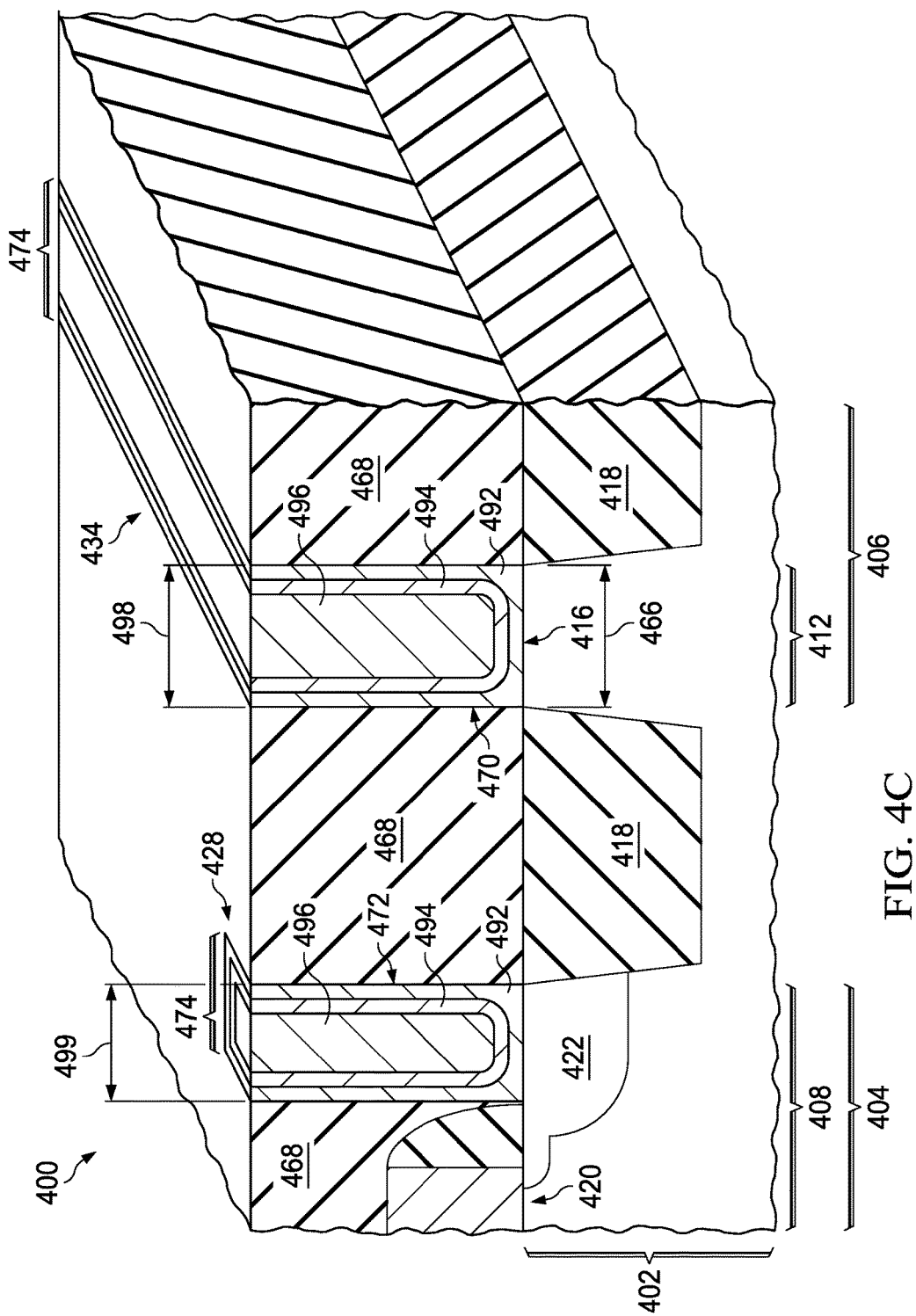

FIG. 4A through FIG. 4C are cross sections of another example integrated circuit containing CMOS transistors and an embedded thermoelectric device, depicted in successive stages of fabrication of a stretch contact on a thermoelectric element. Referring to FIG. 4A, the integrated circuit 400 is formed on a substrate 402 as described in reference to FIG. 1 and FIG. 2A. Field oxide 418 is formed in the substrate 402 to laterally isolate active areas of the integrated circuit 400, including an active area for an MOS transistor 408 in an area for CMOS transistors 404 and an active area for a thermoelectric element 412 of the embedded thermoelectric device 406. A gate structure 420 of the MOS transistor 408 is formed over the substrate 402 in the active area for the MOS transistor 408. A source/drain region 422 of the MOS transistor 408 is formed in the substrate 402 adjacent to and partially underlapping the gate structure 420. A PMD layer 468 is formed over an existing top surface of the integrated circuit 400, as described in reference to FIG. 2B. The PMD layer 468 may optionally be planarized, as depicted in FIG. 4A.

A contact trench 470 and a contact hole 472 are formed through the PMD layer 468 to expose the thermoelectric element 412 and the source/drain region 422, respectively, as described in reference to FIG. 2C. In the instant example, the contact hole 472 has a lateral aspect ratio of substantially 1:1 and the contact trench 470 has a lateral aspect ratio greater than 4:1. In the instant example, a width 488 of the contact trench 470 is substantially equal to a width 466 of the thermoelectric element 412 at a top surface 416 of the substrate 402, and the width 488 of the contact trench 470 is greater than a width 490 of the contact hole 472.

Referring to FIG. 4B, contact metal 474 is formed over the PMD layer 468, extending into the contact trench 470 and the contact hole 472 so as to make electrical connections to the thermoelectric element 412 and the source/drain region 422, respectively. The contact metal 474 may include, for example, a first liner 492 of titanium, a second liner 494 of titanium nitride formed on the first liner 492, and a fill metal 496 of tungsten formed on the second liner 494, as described in reference to FIG. 3B. The contact metal 474 is formed to fill the contact trench 470 and the contact hole 472.

Referring to FIG. 4C, the contact metal 474 is removed from over a top surface of the PMD layer 468, leaving the contact metal 474 in the contact trench 470 and the contact hole 472 to provide a stretch contact 434 on the thermoelectric element 412 and a contact 428 on the source/drain region 422, respectively. The contact metal 374 may be removed by an etchback process and/or a tungsten CMP process. In the instant example, a width 498 of the stretch contact 434 is substantially equal to the width 466 of the thermoelectric element 412 at a top surface 416 of the substrate 402, and greater than a width 499 of the contact 428, which may advantageously improve thermal and electrical conductivity through the stretch contact 434 to the thermoelectric element 412 without unduly requiring an excessive thickness of contact metal 474, thus providing a desired balance of performance of the embedded thermoelectric device 406 and fabrication cost of the integrated circuit 400.

Figure 5A:
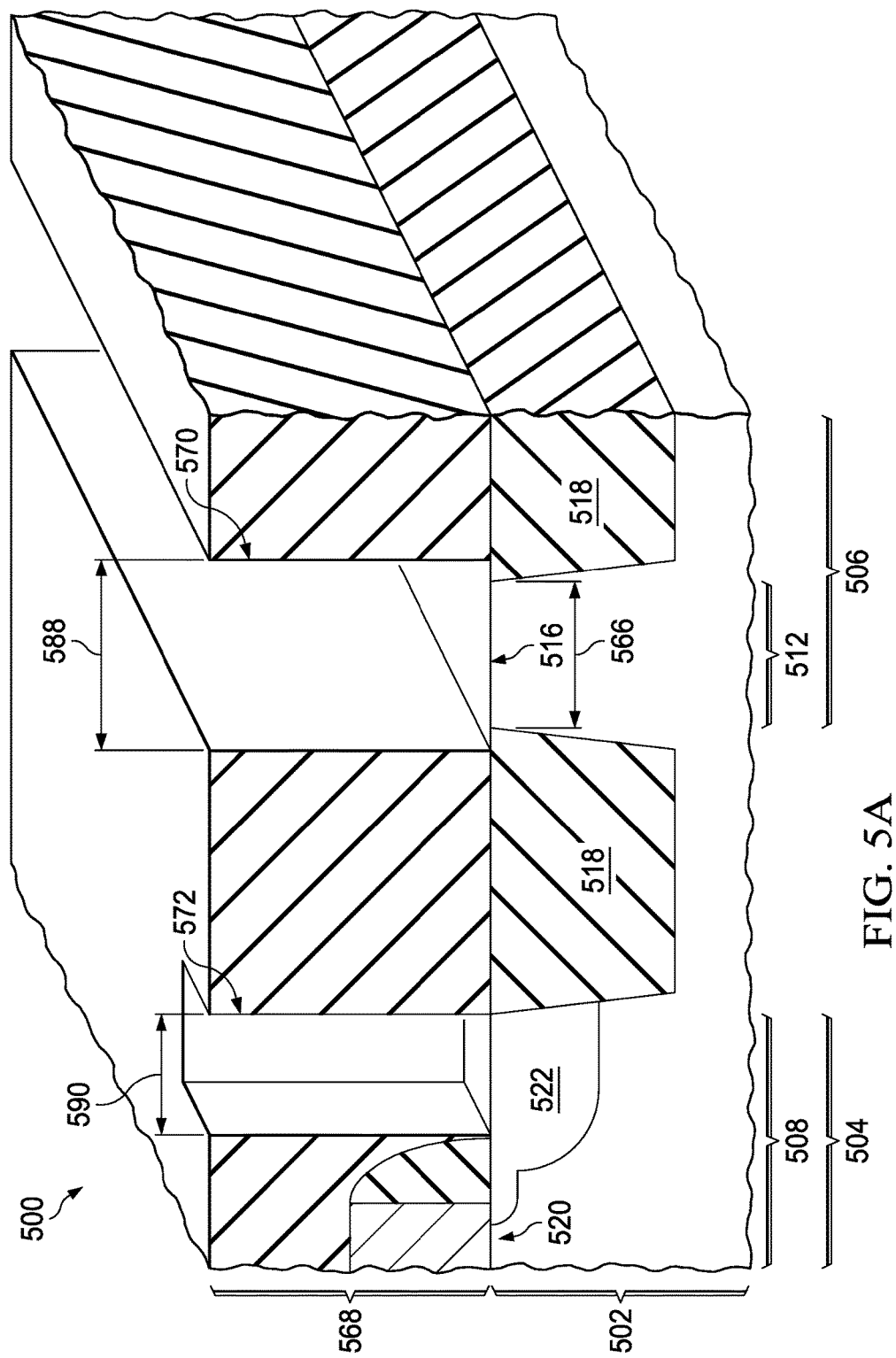
FIG. 5A through FIG. 5C are cross sections of a further example integrated circuit containing CMOS transistors and an embedded thermoelectric device, depicted in successive stages of fabrication of a stretch contact on a thermoelectric element.
Figure 5B:
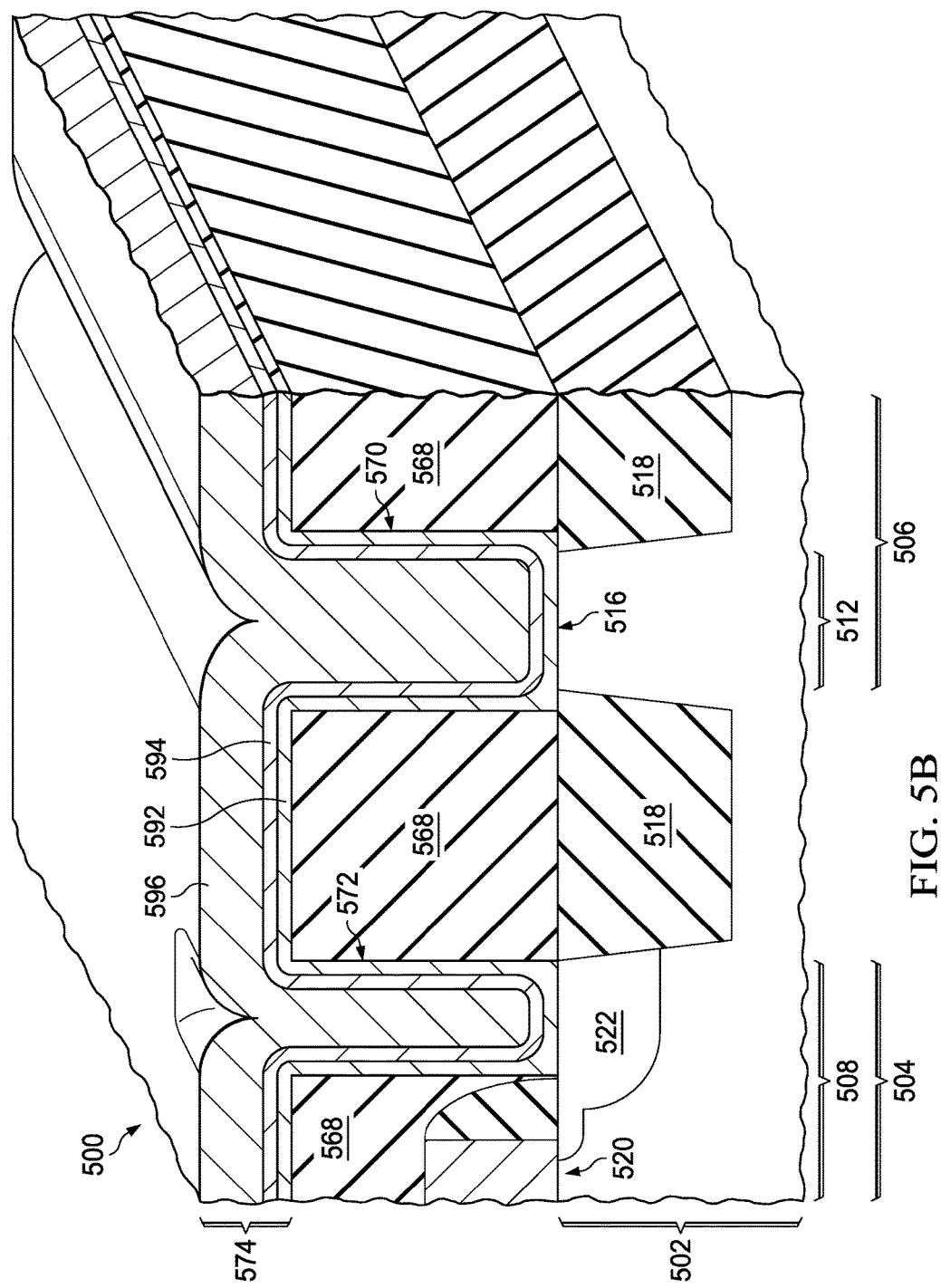
Figure 5C:
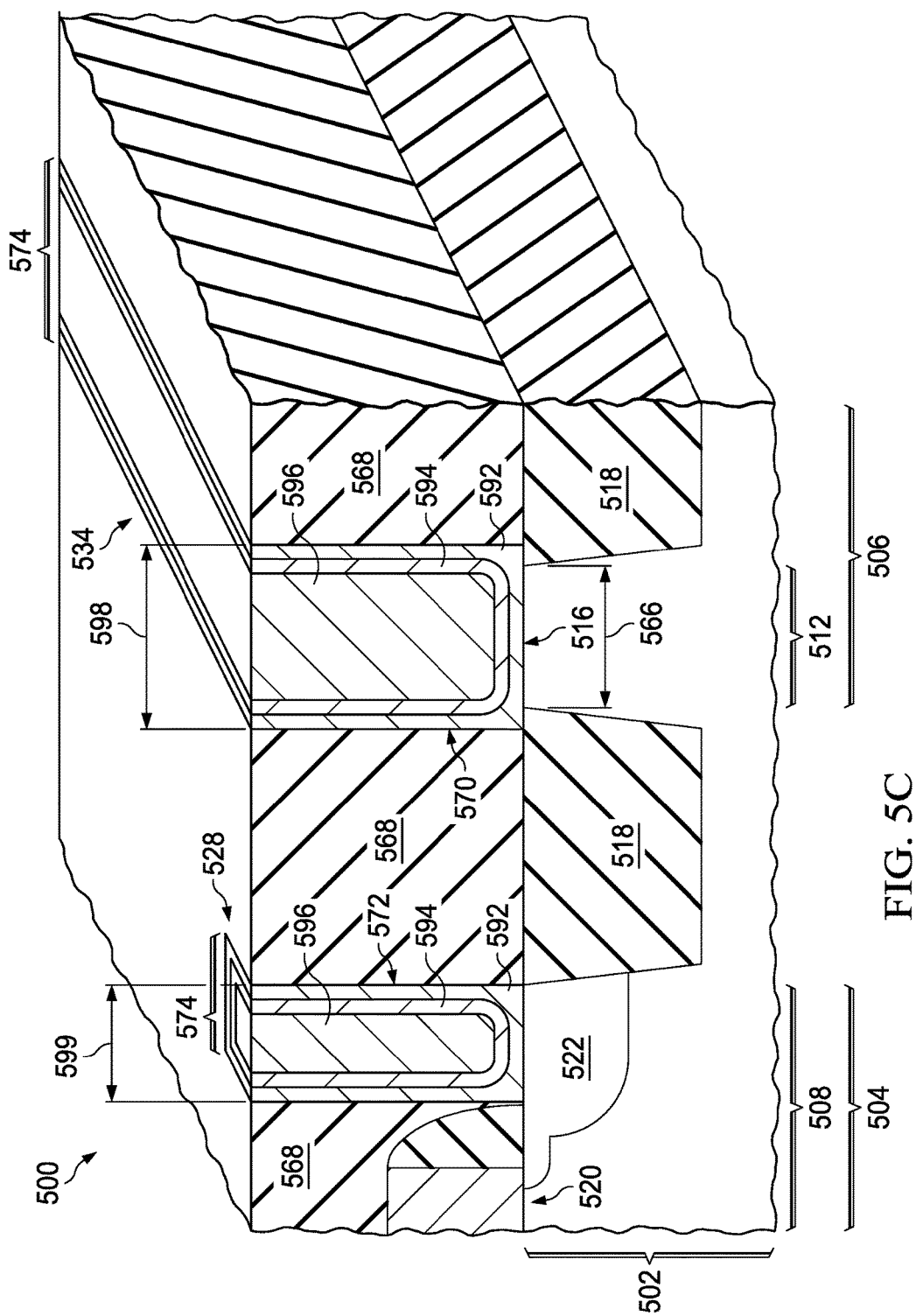

FIG. 5A through FIG. 5C are cross sections of a further example integrated circuit containing CMOS transistors and an embedded thermoelectric device, depicted in successive stages of fabrication of a stretch contact on a thermoelectric element. Referring to FIG. 5A, the integrated circuit 500 is formed on a substrate 502 as described in reference to FIG. 1 and FIG. 2A. Field oxide 518 is formed in the substrate 502 to laterally isolate active areas of the integrated circuit 500, including an active area for an MOS transistor 508 in an area for CMOS transistors 504 and an active area for a thermoelectric element 512 of the embedded thermoelectric device 506. A gate structure 520 of the MOS transistor 508 is formed over the substrate 502 in the active area for the MOS transistor 508. A source/drain region 522 of the MOS transistor 508 is formed in the substrate 502 adjacent to and partially underlapping the gate structure 520. A PMD layer 568 is formed over an existing top surface of the integrated circuit 500, as described in reference to FIG. 2B. The PMD layer 568 may optionally be planarized, as depicted in FIG. 5A.

A contact trench 570 and a contact hole 572 are formed through the PMD layer 568 to expose the thermoelectric element 512 and the source/drain region 522, respectively, as described in reference to FIG. 2C. In the instant example, the contact hole 572 has a lateral aspect ratio of substantially 1:1 and the contact trench 570 has a lateral aspect ratio greater than 4:1. In the instant example, a width 588 of the contact trench 570 is greater than a width 566 of the thermoelectric element 512 at a top surface 516 of the substrate 502, and greater than a width 590 of the contact hole 572.

Referring to FIG. 5B, contact metal 574 is formed over the PMD layer 568, extending into the contact trench 570 and the contact hole 572 so as to make electrical connections to the thermoelectric element 512 and the source/drain region 522, respectively. The contact metal 574 may include, for example, a first liner 592 of titanium, a second liner 594 of titanium nitride formed on the first liner 592, and a fill metal 596 of tungsten formed on the second liner 594, as described in reference to FIG. 3B. The contact metal 574 is formed to fill the contact trench 570 and the contact hole 572.

Referring to FIG. 5C, the contact metal 574 is removed from over a top surface of the PMD layer 568, leaving the contact metal 574 in the contact trench 570 and the contact hole 572 to provide a stretch contact 534 on the thermoelectric element 512 and a contact 528 on the source/drain region 522, respectively. The contact metal 374 may be removed by an etchback process and/or a tungsten CMP process. In the instant example, a width 598 of the stretch contact 534 is greater than a width 599 of the contact 528, and greater than a width 399 of the contact 328, which may advantageously improve thermal and electrical conductivity through the stretch contact 534 to the thermoelectric element 512 compared to configurations with more narrow stretch contacts.

Figure 6A:
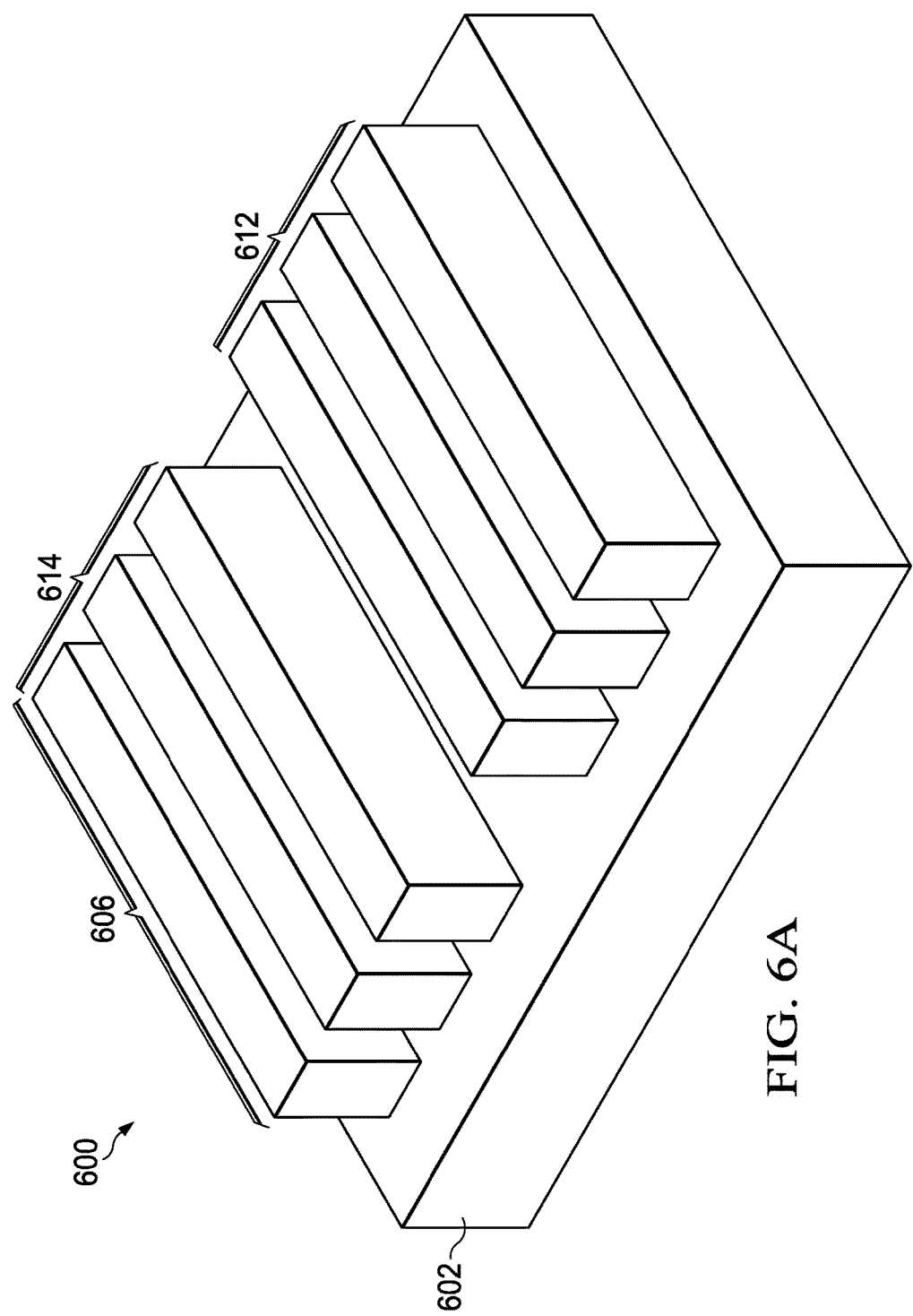
FIG. 6A and FIG. 6B are cross sections of an example integrated circuit containing CMOS transistors and an embedded thermoelectric device, depicted in successive stages of fabrication of a stretch contact on a thermoelectric element.
Figure 6B:
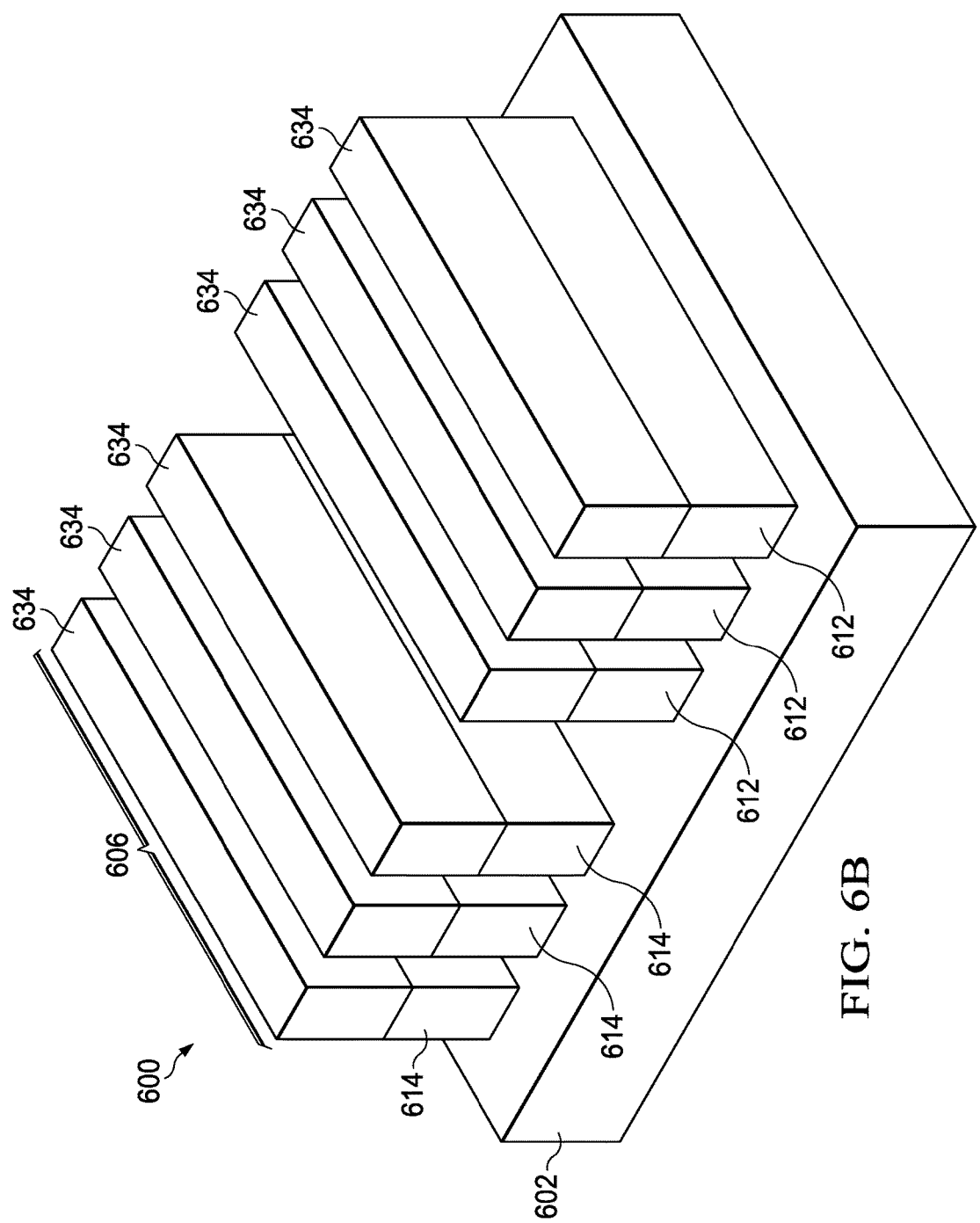

FIG. 6A and FIG. 6B are cross sections of an example integrated circuit containing CMOS transistors and an embedded thermoelectric device, depicted in successive stages of fabrication of a stretch contact on a thermoelectric element. Referring to FIG. 6A, the integrated circuit 600 is formed on a substrate 602 as described in reference to FIG. 1 and FIG. 2A. Field oxide, not shown in FIG. 6A and FIG. 6B, is formed in the substrate 602 to laterally isolate active areas of the integrated circuit 600, including active areas for NMOS transistors and PMOS transistors in an area for CMOS transistors, not shown in FIG. 6A and FIG. 6B, and active areas for n-type thermoelectric elements 612 and p-type thermoelectric elements 614 of the embedded thermoelectric device 606. The field oxide is not shown in FIG. 6A and FIG. 6B in order to more clearly show a configuration of the n-type thermoelectric elements 612 and p-type thermoelectric elements 614. In the instant example, the n-type thermoelectric elements 612 and p-type thermoelectric elements 614 are configured in arrays of linear active areas, which may advantageously provide higher thermoelectric power density per unit area compared to other configurations of the arrays of the n-type and p-type thermoelectric elements 612 and 614, due to a higher density of active area.

Referring to FIG. 6B, a PMD layer, not shown in FIG. 6B, is formed over the substrate 602 and field oxide. Stretch contacts 634 are formed through the PMD layer on the n-type thermoelectric elements 612 and p-type thermoelectric elements 614. In the instant example, the stretch contacts extend along the lengths of the n-type thermoelectric elements 612 and p-type thermoelectric elements 614, advantageously providing low thermal and electrical impedance to the n-type thermoelectric elements 612 and p-type thermoelectric elements 614. The stretch contacts 634 may be formed by any of the examples described herein. The PMD layer is not shown in FIG. 6B in order to more clearly show the spatial configuration of the stretch contacts 634 with respect to the n-type thermoelectric elements 612 and p-type thermoelectric elements 614.

Figure 7A:
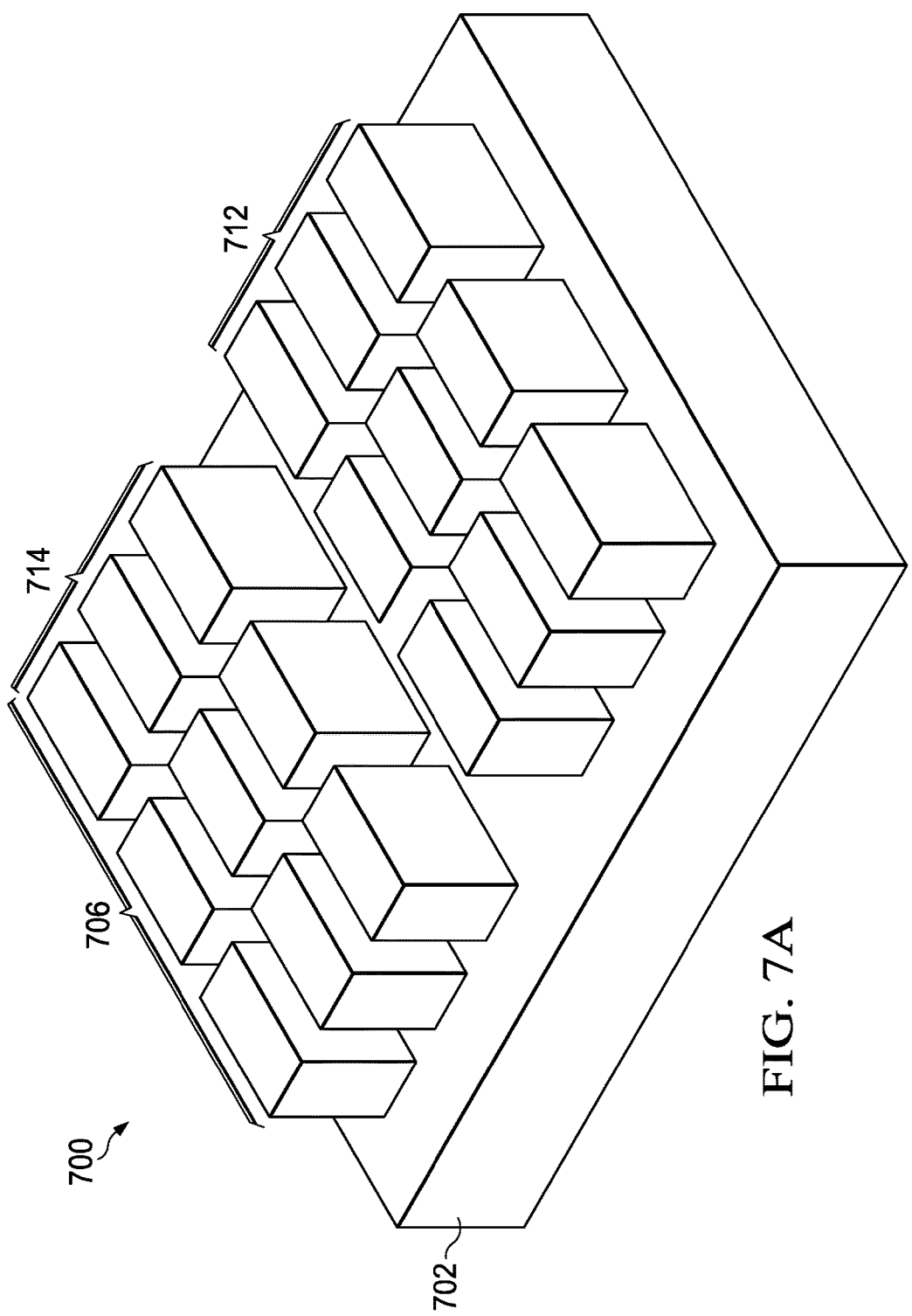
FIG. 7A and FIG. 7B are cross sections of another example integrated circuit containing CMOS transistors and an embedded thermoelectric device, depicted in successive stages of fabrication of a stretch contact on a thermoelectric element.
Figure 7B:
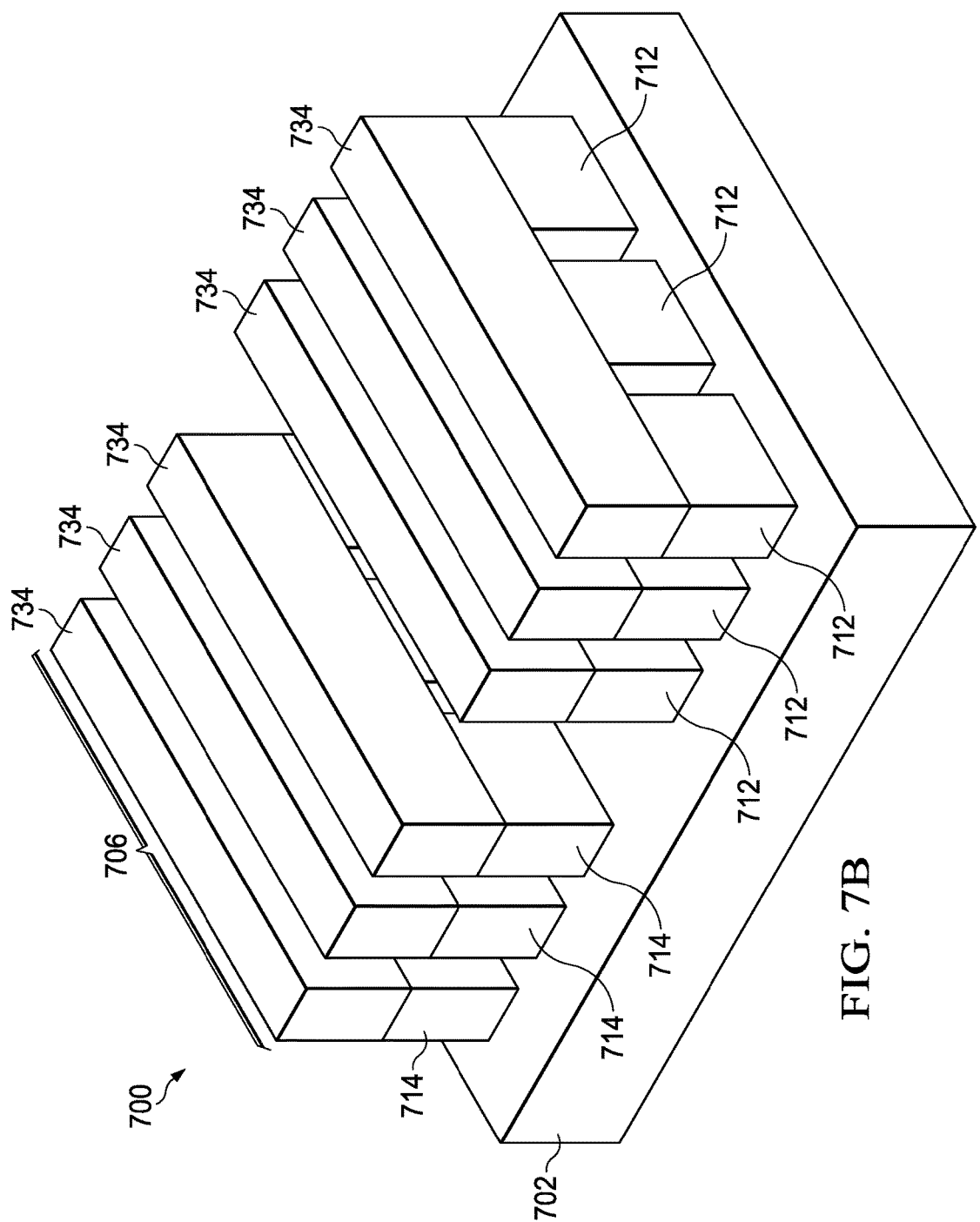

FIG. 7A and FIG. 7B are cross sections of another example integrated circuit containing CMOS transistors and an embedded thermoelectric device, depicted in successive stages of fabrication of a stretch contact on a thermoelectric element. Referring to FIG. 7A, the integrated circuit 700 is formed on a substrate 702 as described in reference to FIG. 1 and FIG. 2A. Field oxide, not shown in FIG. 7A and FIG. 7B, is formed in the substrate 702 to laterally isolate active areas of the integrated circuit 700, including active areas for NMOS transistors and PMOS transistors in an area for CMOS transistors, not shown in FIG. 7A and FIG. 7B, and active areas for n-type thermoelectric elements 712 and p-type thermoelectric elements 714 of the embedded thermoelectric device 706. The field oxide is not shown in FIG. 7A and FIG. 7B in order to more clearly show a configuration of the n-type thermoelectric elements 712 and p-type thermoelectric elements 714. In the instant example, the n-type thermoelectric elements 712 and p-type thermoelectric elements 714 are configured in arrays of segmented linear active areas, which may advantageously provide a desired balance between thermoelectric power density per unit area due to a higher density of active area and thermoelectric efficiency due to increased phonon scattering at sidewalls of the n-type and p-type thermoelectric elements 712 and 714.

Referring to FIG. 7B, a PMD layer, not shown in FIG. 7B, is formed over the substrate 702 and field oxide. Stretch contacts 734 are formed through the PMD layer on the n-type thermoelectric elements 712 and p-type thermoelectric elements 714. In the instant example, the stretch contacts extend along the lengths of the segmented n-type thermoelectric elements 712 and p-type thermoelectric elements 714, so that each stretch contact 734 extends over a plurality of separate segmented n-type or p-type thermoelectric elements 712 or 714, advantageously providing low thermal and electrical impedance to the n-type thermoelectric elements 712 and p-type thermoelectric elements 714. The stretch contacts 734 may be formed by any of the examples described herein. The PMD layer is not shown in FIG. 7B in order to more clearly show the spatial configuration of the stretch contacts 734 with respect to the n-type thermoelectric elements 712 and p-type thermoelectric elements 714.

Figure 8A:
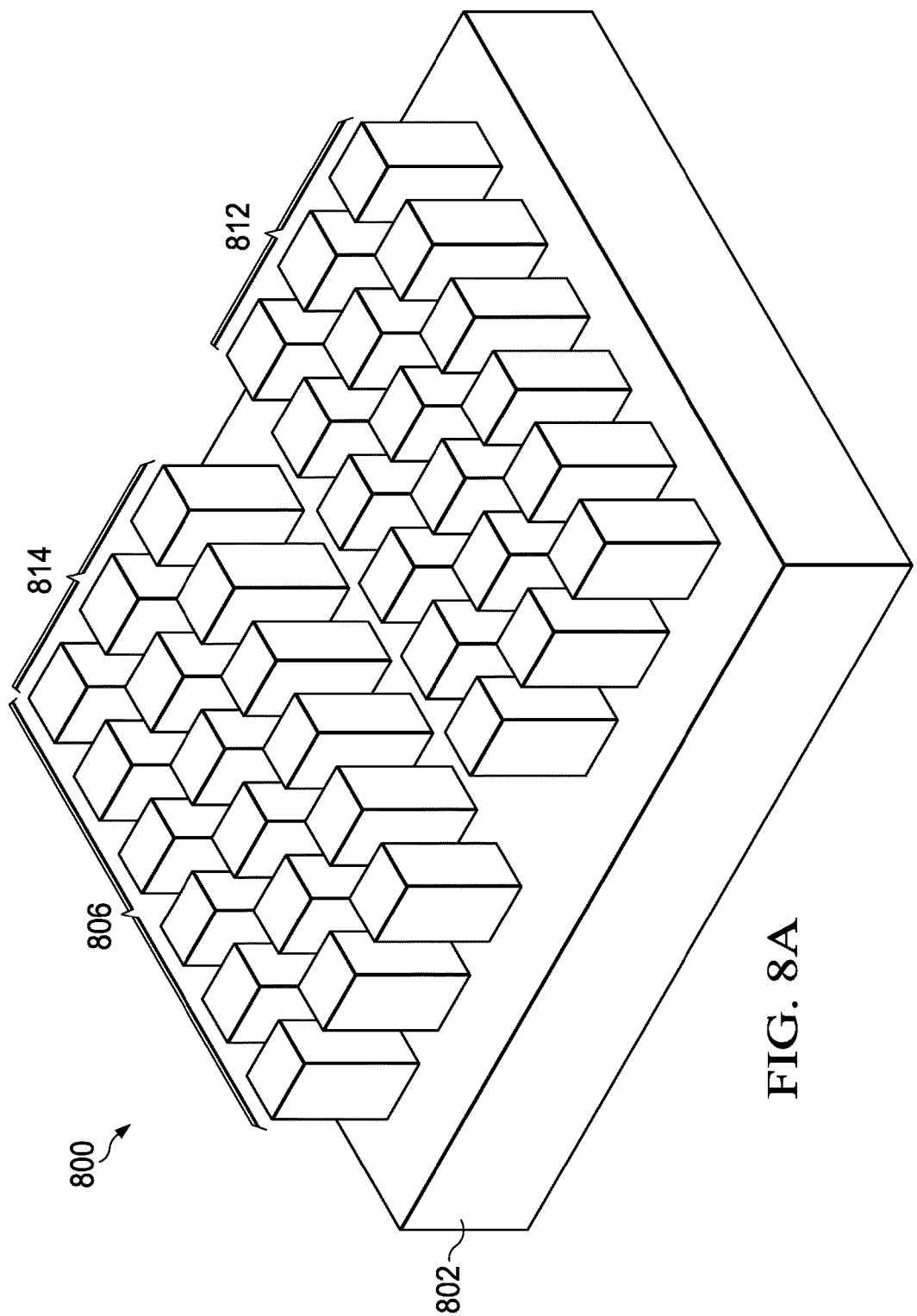
FIG. 8A and FIG. 8B are cross sections of a further example integrated circuit containing CMOS transistors and an embedded thermoelectric device, depicted in successive stages of fabrication of a stretch contact on a thermoelectric element.
Figure 8B:
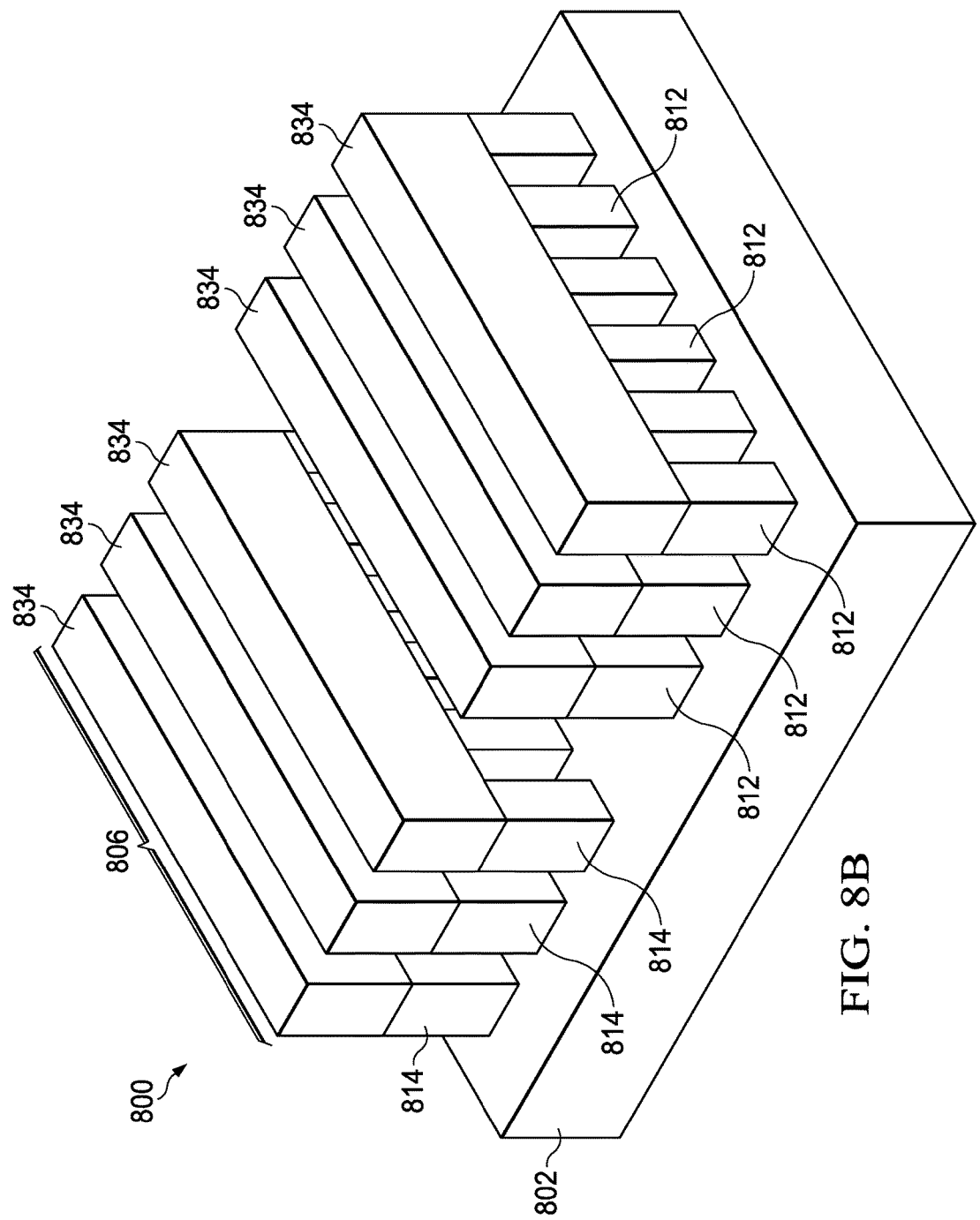

FIG. 8A and FIG. 8B are cross sections of a further example integrated circuit containing CMOS transistors and an embedded thermoelectric device, depicted in successive stages of fabrication of a stretch contact on a thermoelectric element. Referring to FIG. 8A, the integrated circuit 800 is formed on a substrate 802 as described in reference to FIG. 1 and FIG. 2A. Field oxide, not shown in FIG. 8A and FIG. 8B, is formed in the substrate 802 to laterally isolate active areas of the integrated circuit 800, including active areas for NMOS transistors and PMOS transistors in an area for CMOS transistors, not shown in FIG. 8A and FIG. 8B, and active areas for n-type thermoelectric elements 812 and p-type thermoelectric elements 814 of the embedded thermoelectric device 806. The field oxide is not shown in FIG. 8A and FIG. 8B in order to more clearly show a configuration of the n-type thermoelectric elements 812 and p-type thermoelectric elements 814. In the instant example, the n-type thermoelectric elements 812 and p-type thermoelectric elements 814 are configured in rectangular arrays of pillar active areas, which may advantageously provide higher thermoelectric efficiency due to increased phonon scattering at sidewalls of the n-type and p-type thermoelectric elements 812 and 814.

Referring to FIG. 8B, a PMD layer, not shown in FIG. 8B, is formed over the substrate 802 and field oxide. Stretch contacts 834 are formed through the PMD layer on the n-type thermoelectric elements 812 and p-type thermoelectric elements 814. In the instant example, each of the stretch contacts 834 extends over all the pillar n-type thermoelectric elements 812 or p-type thermoelectric elements 814 in a row of one of the rectangular arrays, advantageously providing low thermal and electrical impedance to the n-type thermoelectric elements 812 and p-type thermoelectric elements 814. The stretch contacts 834 may be formed by any of the examples described herein. The PMD layer is not shown in FIG. 8B in order to more clearly show the spatial configuration of the stretch contacts 834 with respect to the n-type thermoelectric elements 812 and p-type thermoelectric elements 814.

Modifications are possible in the described embodiments, and other embodiments are possible, within the scope of the claims e.

What is claimed is:

1. A method of forming an integrated circuit, the method comprising:

providing a substrate comprising silicon-based semiconductor material having a top surface;

forming isolation trenches in the substrate between active areas of the integrated circuit to laterally isolate active areas for an NMOS transistor and a PMOS transistor in an area for CMOS transistors of the integrated circuit, and for n-type thermoelectric elements and p-type thermoelectric elements of an embedded thermoelectric device of the integrated circuit, the n-type thermoelectric elements and the p-type thermoelectric elements being less than 300 nanometers wide at a narrowest position;

forming dielectric material in the isolation trenches to provide field oxide of the integrated circuit;

forming source and drain regions of the NMOS transistor and the PMOS transistor in the substrate adjacent to gate structures of the NMOS transistor and the PMOS transistor;

forming a pre-metal dielectric (PMD) layer over the substrate;

forming contact holes and contact trenches in the PMD layer, the contact holes having lateral aspect ratios of 1:1 to 1.5:1 at the top surface of the substrate and exposing the source and drain regions, and the contact trenches having lateral aspect ratios of greater than 4:1 at the top surface of the substrate and exposing the n-type thermoelectric elements and the p-type thermoelectric elements;

forming contact metal over the PMD layer so as to extend into the contact holes and the contact trenches and make electrical connections to the source and drain regions and the n-type thermoelectric elements and the p-type thermoelectric elements;

removing the contact metal from over a top surface of the PMD layer, leaving the contact metal in the contact holes to provide contacts to the source and drain regions and leaving the contact metal in the contact trenches to provide stretch contacts to the n-type thermoelectric elements and the p-type thermoelectric elements, the contacts having lateral aspect ratios of 1:1 to 1.5:1; and the stretch contacts having lateral aspect ratios greater than 4:1; and forming a plurality of interconnects of metal levels and a plurality of vias of via levels of the integrated circuit connecting the stretch contacts to a thermal node.

2. The method of claim 1, wherein forming the contact metal comprises forming a liner comprising titanium and forming a fill metal comprising tungsten on the liner.

3. The method of claim 1, wherein forming the contact metal comprises forming a first liner of titanium, forming a second liner of titanium nitride on the first liner, and forming a fill metal comprising tungsten on the second liner.

4. The method of claim 1, wherein forming the contact holes and the contact trenches is performed so that a width of the contact trenches is substantially equal to a width of the contact holes, and is less than a width of the n-type thermoelectric elements and the p-type thermoelectric elements at the top surface of the substrate.

5. The method of claim 1, wherein forming the contact holes and the contact trenches is performed so that a width of the contact trenches is greater than a width of the contact holes, and is substantially equal to a width of the n-type thermoelectric elements and the p-type thermoelectric elements at the top surface of the substrate.

6. The method of claim 1, wherein forming the contact holes and the contact trenches is performed so that a width of the contact trenches is greater than a width of the contact holes, and is greater than a width of the n-type thermoelectric elements and the p-type thermoelectric elements at the top surface of the substrate.

7. The method of claim 1, wherein forming the isolation trenches is performed so that the n-type thermoelectric elements and the p-type thermoelectric elements are configured in arrays of linear active areas.

8. The method of claim 1, wherein forming the isolation trenches is performed so that the n-type thermoelectric elements and the p-type thermoelectric elements are configured in rectangular arrays of pillar active areas.

9. The method of claim 1, wherein forming the plurality of the interconnects includes forming interconnects of a first metal level on the stretch contacts, to make electrical and thermal connections to the stretch contacts, so as to overlap the stretch contacts by an overlap distance which is 25 percent to 50 percent of an average pitch of the stretch contacts.

10. The method of claim 1, wherein forming the plurality of the vias includes forming stretch vias of a first via level on interconnects of a first metal level on the stretch contacts, the stretch vias of the first via level having lateral aspect ratios of greater than 4:1.

* * * * *